(12) United States Patent
Forbes et al.

(10) Patent No.: US 6,952,032 B2
(45) Date of Patent: Oct. 4, 2005

(54) PROGRAMMABLE ARRAY LOGIC OR MEMORY DEVICES WITH ASYMMETRICAL TUNNEL BARRIERS

(75) Inventors: Leonard Forbes, Corvallis, OR (US); Jerome M. Eldridge, Los Gatos, CA (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,540

(22) Filed: Aug. 31, 2004

(65) Prior Publication Data

US 2005/0023595 A1 Feb. 3, 2005

Related U.S. Application Data

(62) Division of application No. 09/943,134, filed on Aug. 30, 2001.

(51) Int. Cl.[7] .............................................. H01L 29/76

(52) U.S. Cl. ..................................... 257/314; 257/315

(58) Field of Search ................................ 257/314, 315

(56) References Cited

U.S. PATENT DOCUMENTS

| | | | |
|---|---|---|---|
| 4,295,150 A | 10/1981 | Adam | 357/54 |
| 4,412,902 A | 11/1983 | Michikami et al. | 204/192 |
| 4,688,078 A | 8/1987 | Hseih | 257/321 |
| 4,757,360 A | 7/1988 | Faraone | 357/23.5 |
| 4,780,424 A | 10/1988 | Holler et al. | 437/29 |
| 4,939,559 A | 7/1990 | DiMaria et al. | 257/38 |
| 5,071,782 A | 12/1991 | Mori | 437/48 |
| 5,073,519 A | 12/1991 | Rodder | 438/269 |

(Continued)

OTHER PUBLICATIONS

Aarik, Jaan, et al., "Anomalous effect of temperature on atomic layer deposition of titanium dioxide", *Journal of Crystal Growth, 220(4)*, (Dec. 2000,)531–537.

Aarik, Jaan, et al., "Texture development in nanocrystalline hafnium dioxide thin films grown by atomic layer deposition", *Journal of Crystal Growth, 220(1–2)*, (Nov. 15, 2000), 105–113.

Afanas'ev, V. , et al., "Electron energy barriers between (100)Si and ultrathin stacks of SiO2, Al2O3, and ZrO2 insulators", *Applied Physics Letters, 78(20)*, (May 14, 2001),3073–3075.

(Continued)

*Primary Examiner*—David Nelms
*Assistant Examiner*—Tu-Tu Ho
(74) *Attorney, Agent, or Firm*—Schwegman, Lundberg, Woessner & Kluth, P.A.

(57) ABSTRACT

Structures and methods for programmable array type logic and/or memory devices with asymmetrical low tunnel barrier intergate insulators are provided. The programmable array type logic and/or memory devices include non-volatile memory which has a first source/drain region and a second source/drain region separated by a channel region in a substrate. A floating gate opposing the channel region and is separated therefrom by a gate oxide. A control gate opposes the floating gate. The control gate is separated from the floating gate by an asymmetrical low tunnel barrier intergate insulator. The asymmetrical low tunnel barrier intergate insulator includes a metal oxide insulator selected from the group consisting of $Al_2O_3$, $Ta_2O_5$, $TiO_2$, $Zro_2$, $Nb_2O_5$, $SrBi_2Ta_2O_3$, $SrTiO_3$, $PbTiO_3$, and $PbZrO_3$. The floating gate includes a polysilicon floating gate having a metal layer formed thereon in contact with the low tunnel barrier intergate insulator. And, the control gate includes a polysilicon control gate having a metal layer, having a different work function from the metal layer formed on the floating gate, formed thereon in contact with the low tunnel barrier intergate insulator.

61 Claims, 18 Drawing Sheets

U.S. PATENT DOCUMENTS

| | | |
|---|---|---|
| 5,350,738 A | 9/1994 | Hase et al. ............... 505/473 |
| 5,399,516 A | 3/1995 | Bergendahl et al. .......... 437/43 |
| 5,418,389 A | 5/1995 | Watanabe ................ 257/295 |
| 5,474,947 A | 12/1995 | Chang et al. |
| 5,488,612 A | 1/1996 | Heybruck ................ 714/725 |
| 5,498,558 A | 3/1996 | Kapoor .................... 437/43 |
| 5,508,544 A | 4/1996 | Shah ..................... 257/316 |
| 5,600,592 A | 2/1997 | Atsumi et al. ......... 365/185.18 |
| 5,618,575 A | 4/1997 | Peter ......................... 427/8 |
| 5,677,867 A | 10/1997 | Hazani ................... 365/185 |
| 5,801,401 A | 9/1998 | Forbes ..................... 257/77 |
| 5,852,306 A | 12/1998 | Forbes .................... 257/315 |
| 5,880,991 A | 3/1999 | Hsu et al. ............... 365/182 |
| 5,923,056 A | 7/1999 | Lee et al. ............... 257/192 |
| 5,936,274 A | 8/1999 | Forbes et al. ............ 257/315 |
| 5,952,692 A | 9/1999 | Nakazato et al. ......... 257/321 |
| 5,959,465 A | 9/1999 | Beat ......................... 326/39 |
| 5,981,350 A | 11/1999 | Geusic et al. ............ 438/386 |
| 5,986,932 A | 11/1999 | Ratnakumar et al. .. 365/185.07 |
| 5,991,225 A | 11/1999 | Forbes et al. ......... 365/230.06 |
| 6,009,011 A | 12/1999 | Yamauchi |
| 6,025,228 A | 2/2000 | Ibok et al. ............... 438/261 |
| 6,025,627 A | 2/2000 | Forbes et al. ............ 257/321 |
| 6,031,263 A | 2/2000 | Forbes et al. ............ 257/315 |
| 6,069,380 A | 5/2000 | Chou et al. .............. 257/315 |
| 6,069,816 A | 5/2000 | Nishimura ............... 365/145 |
| 6,124,729 A | 9/2000 | Noble et al. ............... 326/41 |
| 6,134,175 A | 10/2000 | Forbes et al. ......... 365/230.06 |
| 6,141,238 A | 10/2000 | Forbes et al. ............ 365/145 |
| 6,141,248 A | 10/2000 | Forbes et al. ......... 365/185.08 |
| 6,143,636 A | 11/2000 | Forbes et al. ............ 438/587 |
| 6,163,049 A | 12/2000 | Bui ......................... 257/321 |
| 6,169,306 B1 | 1/2001 | Gardner et al. ........... 257/310 |
| 6,208,164 B1 | 3/2001 | Noble et al. ............... 326/41 |
| 6,210,999 B1 | 4/2001 | Gardner et al. ........... 438/183 |
| 6,229,175 B1 | 5/2001 | Uchida .................... 257/315 |
| 6,238,976 B1 | 5/2001 | Noble et al. .............. 257/259 |
| 6,246,606 B1 | 6/2001 | Forbes et al. ......... 365/185.03 |
| 6,249,020 B1 | 6/2001 | Forbes et al. ............ 257/315 |
| 6,249,460 B1 | 6/2001 | Forbes et al. ......... 365/185.28 |
| 6,307,775 B1 | 10/2001 | Forbes et al. ......... 365/185.01 |
| 6,317,364 B1 | 11/2001 | Guterman et al. |
| 6,341,084 B2 | 1/2002 | Numata et al. |
| 6,351,411 B2 | 2/2002 | Forbes et al. ............ 365/182 |
| 6,377,070 B1 | 4/2002 | Forbes ..................... 326/41 |
| 6,424,001 B1 | 7/2002 | Forbes et al. ............ 257/315 |
| 6,461,931 B1 | 10/2002 | Eldridge .................. 438/398 |
| 6,475,857 B1 | 11/2002 | Kim et al. ............... 438/240 |
| 6,514,842 B1 | 2/2003 | Prall et al. ............... 438/593 |
| 6,541,280 B2 | 4/2003 | Kaushik et al. ............. 438/3 |
| 6,574,143 B2 | 6/2003 | Nakazato |
| 6,586,797 B2 | 7/2003 | Forbes et al. ............ 257/325 |
| 6,730,575 B2 | 5/2004 | Eldridge .................. 257/310 |
| 6,754,108 B2 | 6/2004 | Forbes |
| 6,778,441 B2 | 8/2004 | Forbes et al. |
| 2001/0013621 A1 | 8/2001 | Nakazato ................ 257/314 |
| 2003/0043637 A1 | 3/2003 | Forbes et al. |
| 2003/0207032 A1 | 11/2003 | Ahn et al. |
| 2003/0207540 A1 | 11/2003 | Ahn et al. |
| 2005/0023602 A1 | 2/2005 | Forbes et al. |
| 2005/0023603 A1 | 2/2005 | Eldridge et al. |
| 2005/0026349 A1 | 2/2005 | Forbes et al. |

OTHER PUBLICATIONS

Arya, S. P., et al., "Conduction properties of thin $Al_2O_3$ films", *Thin Solid Films, 91(4)*, (May 28, 1982), 363–374.

Dipert, Brian, "Flash Memory Goes Mainstrem", *IEEE Spectrum 30(10)*, (Oct. 1993),48–52.

Eierdal, L. , et al., "Interaction of oxygen with Ni(110) studied by scanning tunneling microscopy", *Surface Science, 312(1–2)*, (Jun. 1994),31–53.

Eldridge, J. M., et al., "Analysis of ultrathin oxide growth on indium", *Thin Solid Films, 12(2)*, (Oct. 1972),447–451.

Eldridge, J. M., et al., "Growth of Thin PbO Layers on Lead Films. I. Experiment", *Surface Science, 40(3)*, (Dec. 1973), 512–530.

Eldridge, J. , et al., "Measurement of Tunnel Current Density in a Metal–Oxide–Metal System as a Function of Oxide Thickness", *Proc. 12th Intern. Conf. on Low Temperature Physics*, (1971),427–428.

Eldridge, J.M. , et al., "The Growth of Thin PbO Layers on Lead Films", *Surface Science, 40*, (1973),512–530.

Ferguson, J D., et al., "Atomic layer deposition of $Al_2O_3$ and $SiO_2$ on BN particles using sequential surface reactions", *Applied Surface Science, 162–163*, (Aug. 1, 2000), 280–292.

Greiner, J. , "Josephson Tunneling Barriers by rf Sputter Etching in an Oxygen Plasma", *Journal of Applied Physics, 42(12)*, (Nov. 1971),5151–5155.

Greiner, J. , "Oxidation of lead films by rf sputter etching in an oxygen plasma", *Journal of Applied Physics, 45(1)*, (1974),32–37.

Grimblot, Jean , et al., "I. Interaction of Al films with o2 at low pressures", *Journal of the Electrochemical Society, 129(10)*, (1982),2366–2368.

Grimbolt, J. , "II. Oxidation of Al Films", *Journal of Electrochem Soc.: Solid–State Science and Technology*, (1982),pp. 2369–2372.

Gundlach, K. , et al., "Logarithmic conductivity of $Al–Al_2O_3–Al$ tunneling junctions produced by plasma– and by thermal–oxidation", *Surface Science, 27(1)*, (Aug. 1971),125–141.

Guo, X. , "High Quality Ultra–thin (1.5nm) High quality ultra–thin (1.5nm) $TiO_2–Si_3N_4$ gate dielectric for deep sub–micron CMOS technology", *International Electron Devices Meeting 1999, Technical Digest*, (1999), 137–140.

Hodges, D. A., et al., "Analysis and Design of Digital Integrated Circuits", *McGraw–Hill Book Company, 2nd Edition*, (1988),394–396.

Hurych, Z. , "Influence of Non–Uniform Thickness of Dielectric Layers on Capacitance and Tunnel Currents", *Solid–State Electronics, 9*, (1966),967–979.

Itokawa, H , "Determination of Bandgap and Energy Band Alignment for High–Dielectric–Constant Gate Insulators Using High–Resolution X–ray Photoelectron Spectroscopy", *Extended Abstracts of the 1999 International Conference on Solid State Devices and Materials*, (1999),158–159.

Kim, Yong S., et al., "Effect of rapid thermal annealing on the structure and the electrical properties of atomic–layer–deposited $Ta_2O_5$ films", *Journal of the Korean Physical Society*, (Dec. 2000),975–979.

Kim, H. , "Leakage current and electrical breakdown in metal–organic chemical vapor depostied $TiO_2$ dielectrics on silicon substrates", *Applied Physics Letters 69(25)*, (Dec. 16, 1996),3860–3862.

Kim, Yeong K., et al., "Novel capacitor technology for high density stand–alone and embedded DRAMs", *International Electron Devices Meeting 2000. Technical Digest. IEDM*, (2000),369–372.

Kubaschewski, O., et al., "Oxidation of Metals and Alloys", *Butterworths, London,* (1962),53–63.

Kubaschewski, O., et al., "Oxidation of Metals and Alloys,", *Butterworths, London,* Second Edition,(1962),1–3, 5,6, 8–12, 24, 36–39.

Kukli, Kaupo, "Atomic Layer Deposition of Titanium Oxide from TiI4 and H2O2", *Chemical Vapor Deposition, 6(6),* (2000),303–310.

Kukli, Kaupo, et al., "Atomic layer depositin of zicronium oxide from zirconium tetraiodide, water and hydrogen peroxide", *Journal of Crystal Growth, 231(1–2),* (Sep. 2001), 262–272.

Kukli, K., "Development of Dielectric Properties of Niobium Oxide, Tantalum Oxide, and Aluminum Oxide Based Nanolayered Materials", *Journal of the Electrochemical Society, 148(2),* (Feb. 2001), F35–F41.

Kukli, Kaupo, et al., "Real–time monitoring in atomic layer deposition of TiO/sub 2/ from TiI/sub 4/ and H/sub 2/O–H/sub 2/O/sub 2/", *Langmuir, 16(21),* (Oct. 17, 2000),8122–8128.

Kwo, J., "Properties of high κ gate dielectrics Gd2O3 and Y2O3 for Si", *Journal of Applied Physics, 89(7),* (2001), 3920–3927.

Lee, J., et al., "Effect of polysilicon gate on the flatband voltage shift and mobility degradation for ALD–Al/sub 2/O/sub 3/ gate dielectric", *International Electron Devices Meeting 2000. Technical Digest. IEDM,* (2000),645–648.

Luan, H., "High Quality Ta2O5 Gate Dielectrics with Tox,eq<10A", *IEDM,* (1999),pp. 141–144.

Luan, H. F., "High Quality Ta2O5 Gate Dielectrics with Tox,eq<10A", *IEDM Technical Digest. International Electron Devices Meeting,* (Dec. 5–8, 1999),141–143.

Ma, Yanjun, et al., "Zirconium oxide based gate dielectrics with equivalent oxide thickness of less than 1.0 nm and performance of submicron MOSFET using a nitride gate replacement process", *International Electron Devices Meeting 1999. Technical Digest.* (1999),149–152.

Marshalek, R., et al., "Photoresponse Characteristics of Thin–Film Nickel–Nickel Oxide–Nickel Tunneling Junctions", *IEEE Journal of Quantum Electronics, QE–19(4),* (1983),743–754.

Masuoka, F., et al., "A 256K Flash EEPROM using Triple Polysilicon Technology", *IEEE International Solid–State Circuits Conference, Digest of Technical Papers,* (1985), 168–169.

Masuoka, F., et al., "A New Flash EEPROM Cell using Triple Polysilicon Technology", *International Electron Devices Meeting, Technical Digest,* San Francisco, CA,(1984),464–467.

Mori, S., et al., "Reliable CVD Inter–Poly Dielectrics for Advanced E&EEPROM", *Symposium on VSLI Technology, Digest of Technical Papers,* (1985),16–17.

Muller, H., "Electrical and Optical Properties of Sputtered In2O3 Films", *Physica Status Solidi, 27(2),* (1968),723–731.

Paranjpe, Ajit, et al., "Atomic layer deposition of AlOx for thin film head gap applications", *Journal of the Electrochemical Society, 148(9),* (Sep. 2001),465–471.

Pashley, R., et al., "Flash Memories: the best of two worlds", *IEEE Spectrum, 26(12),* (Dec. 1989),30–33.

Pollack, S., et al., "Tunneling Through Gaseous Oxidized Films of Al2O3", *Transactions of the Metallurgical Society of AIME, 233,* (1965),497–501.

Qi, Wen–Jie, "MOSCAP and MOSFET characteristics using ZrO/sub 2/ gate dielectric deposited directly on Si", *International Electron Devices Meeting 1999. Technical Digest.* (1999),145–148.

Robertson, J., "Band offsets of wide–band–gap oxides and implications for future electronic devices", *Journal of Vacuum Science & Technology B (Microelectronics and Nanometer Structures), 18(3),* (May–Jun. 2000),1785–1791.

Robertson, J., "Schottky barrier heights of tantalum oxide, barium strontium–titanate, lead titanate, and strontium bismuth tantalate", *Applied Physics Letters, 74(8),* (Feb. 22, 1999),1168–1170.

Shi, Y., "Tunneling Leakage Current in Ultrathin (<4 nm) Nitride/Oxide Stack Dielectrics", *IEEE Electron Device Letters, 19(10),* (Oct. 1998),388–390.

Simmons, J., "Generalized Formula for the Electric Tunnel Effect between Similar Electrodes Separated by a Thin Insulating Film", *Journal of Applied Physics, 34(6),* (1963), 1793–1803.

Smith, Ryan C., et al., "Chemical vapour deposition of the oxides of titanium, zirconium and hafnium for use as high–κ materials in microelectronic devices. A carbon–free precursor for the synthesis of hafnium dioxide", *Advanced Materials for Optics and Electronics, 10(3–5),* (May–Oct. 2000), 105–106.

Swalin, R., "Equilibrium between Phases of Variable Composition", *In: Thermodynamics of solids,* New York, J. Wiley, 2nd Edition,(1972),165–180.

Sze, S., "Physics of Semiconductor Devices, Second Edition", *John Wiley & Sons, New York,* (1981),553–556.

Yan, J., et al., "Structural and electrical characterization of TiO/sub 2/ grown from titanium tetrakis–isopropoxide (TTIP) and TTIP/H/sub 2/O ambients", *Journal of Vacuum Science & Technology B (Microelectronics and Nanometer Structures), 14(3),* (May–Jun. 1996),1706–1711.

Zhang, H., et al., "Atomic layer deposition of high dielectric constant nanolaminates", *Journal of The Electrochemical Society, 148(4),* (Apr. 2001),F63–F66.

|  | $E_G$ | $\epsilon_r$ | $\epsilon_\infty$ | $\chi$ | $\phi_o$ (Pt) | $\phi_o$ (Al) |
|---|---|---|---|---|---|---|
| Conventional Insulators | | | | | | |
| $SiO_2$ | ~ 8 eV | 4 | 2.25 | 0.9 eV | | 3.2 eV |
| $Si_3N_4$ | ~ 5 eV | 7.5 | 3.8 | | | 2.4 eV |
| Metal Oxides | | | | | | |
| $Al_2O_3$ | 7.6 eV | 9 to 11 | 3.4 | | | ~ 2 eV |
| NiO | | | | | | |
| Transition Metal Oxides | | | | | | |
| $Ta_2O_5$ | 4.65 - 4.85 | | 4.8 | 3.3 | 2.0 | 0.8 eV |
| $TiO_2$ | 6.8 | 30 80 | 7.8 | 3.9 | est. 1.2 eV | |
| $ZrO_2$ | 5 - 7.8 | 18.5 25 | 4.8 | 2.5 | | 1.4 |
| $Nb_2O_5$ | 3.1 | 35-50 | | | | |
| $Y_2O_3$ | 6 | | 4.4 | | | 2.3 |
| $Gd_2O_3$ | | | | | | |
| Perovskite Oxides | | | | | | |
| $SrBi_2Ta_2O_3$ | 4.1 | | 5.3 | 3.3 | 2.0 | 0.8 eV |
| $SrTiO_3$ | 3.3 | | 6.1 | 3.9 | 1.4 | 0.2 eV |
| $PbTiO_3$ | 3.4 | | 6.25 | 3.5 | 1.8 | 0.6 eV |
| $PbZrO_3$ | 3.7 | | 4.8 | | est. 1.4 eV | 0.2 eV |

| Metal | Osygen Solub., at. % | Oxide Stability Range* | Semicond. Type | Structure Temp. | Transform Temp., °C |
|---|---|---|---|---|---|
| Ta | 0.8 | $TaO_{4.7-5.0}$ | n | Orthorhom. | t.p. 1350 |
| Ti | 28 | $TiO_{3.82-5.0}$ | n | Rutile | m.p. 1920 |
| Zr | 29 | $ZrO_{3.66-5.0}$ | n | Monoclinic | t.p. 1170 |
| Nb | 2.3 | $Nb_2O_{4.86-5.0}$ | n | Monoclinic | m.p. 1495 |
| Al | v. small | $Al_2O_{2.999-3.0}$ | n | Corundum | m.p. 2050 |
| Pb | v. small | PbO | (p) | Orthorhom. | m.p. 885 |
| Si | v. small | $SiO_2$ | n or p | Tetra. (Cyst.) | m.p. 1713 |

FIG. 10

| Metal | Work Function, eV | | |
|---|---|---|---|
| | From C-V | From Photoresponse | From Vacuum |
| Cs | | | 2.2 |
| Eu | | | 2.5 |
| Sm | | | 2.7 |
| Li | | | 2.9 |
| Ca | | | 3.0 |
| Al | 4.1 | 4.1 | 4.25 |
| Cu | 4.7 | 4.7 | 4.25 |
| Au | 5.0 | 5.0 | 4.8 |
| Ag | 5.1 | 5.05 | 4.3 |
| Ti | | | 4.3 |
| Mo | | | 4.7 |
| Rh | | | 5.1 |
| Ir | | | 5.3 |
| Pt | | | 5.8 |
| Se | | | 5.9 |

FIG. 11

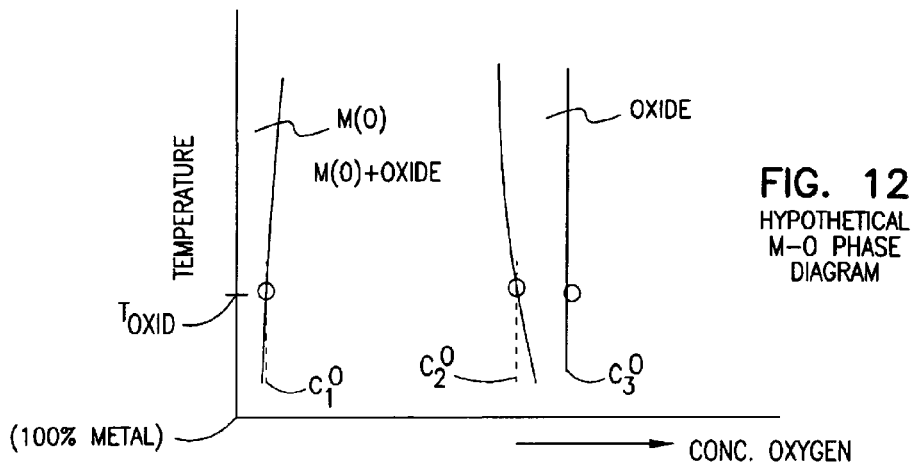
FIG. 12
HYPOTHETICAL
M-O PHASE
DIAGRAM
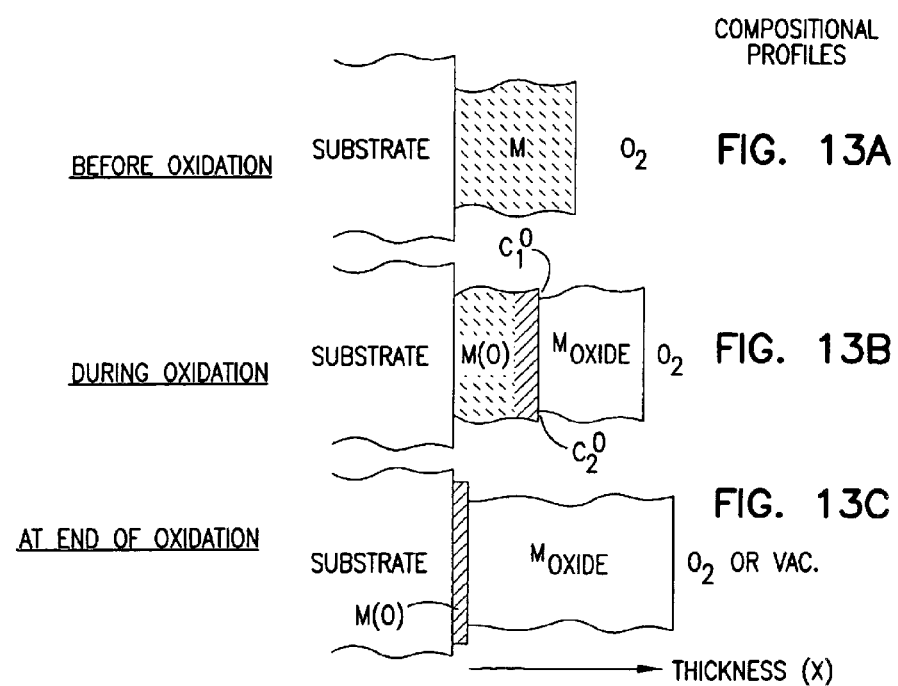
FIG. 13A
FIG. 13B
FIG. 13C

PROGRAMMABLE ARRAY LOGIC OR MEMORY DEVICES WITH ASYMMETRICAL TUNNEL BARRIERS

This application is a Divisional of and claims priority to U.S. application Ser. No. 09/943,134, filed Aug. 30, 2001.

CROSS REFERENCE TO RELATED APPLICATIONS

This application is related to the following co-pending, commonly assigned U.S. patent applications: "DRAM Cells with Repressed Memory Metal Oxide Tunnel Insulators,", Ser. No. 09/945,395, "Flash Memory with Low Tunnel Barrier Interpoly Insulators,", Ser. No. 09/945,507, "Dynamic Electrically Alterable Programmable Memory with Insulating Metal Oxide Interpoly Insulators,", Ser. No. 09/945,498, and "Field Programmable Logic Arrays with Metal Oxide and/or Low Tunnel Barrier Interpoly Insulators,", Ser. No. 09/945,512, "SRAM Cells with Repressed Floating Gate Memory, Metal Oxide Tunnel Interpoly Insulators,", Ser. No. 09/945,554, "Programmable Memory Address and Decode Devices with Low Tunnel Barrier Interpoly Insulators,", Ser. No. 09/945,500, which are filed on even date herewith and each of which disclosure is herein incorporated by reference.

FIELD OF THE INVENTION

The present invention relates generally to integrated circuits, and in particular to programmable array type logic and/or memory devices with asymmetrical low tunnel barrier interpoly insulators.

BACKGROUND OF THE INVENTION

Flash memories have become widely accepted in a variety of applications ranging from personal computers, to digital cameras and wireless phones. Both INTEL and AMD have separately each produced about one billion integrated circuit chips in this technology.

The original EEPROM or EARPROM and flash memory devices described by Toshiba in 1984 used the interpoly dielectric insulator for erase. (See generally, F. Masuoka et al., "A new flash EEPROM cell using triple polysilicon technology," IEEE Int. Electron Devices Meeting, San Francisco, pp. 464–67, 1984; F. Masuoka et al., "256K flash EEPROM using triple polysilicon technology," IEEE Solid-State Circuits Conf., Philadelphia, pp. 168–169, 1985). Various combinations of silicon oxide and silicon nitride were tried. (See generally, S. Mori et al., "reliable CVD inter-poly dialectics for advanced E&EEPROM," Symp. On VLSI Technology, Kobe, Japan, pp. 16–17, 1985). However, the rough top surface of the polysilicon floating gate resulted in, poor quality interpoly oxides, sharp points, localized high electric fields, premature breakdown and reliability problems.

Widespread use of flash memories did not occur until the introduction of the ETOX cell by INTEL in 1988. (See generally, U.S. Pat. No. 4,780,424, "Process for fabricating electrically alterable floating gate memory devices," 25 Oct. 1988; B. Dipert and L. Hebert, "Flash memory goes mainstream," IEEE Spectrum, pp. 48–51, October, 1993; R. D. Pashley and S. K. Lai, "Flash memories, the best of two worlds," IEEE Spectrum, pp. 30–33, December 1989). This extremely simple cell and device structure resulted in high densities, high yield in production and low cost. This enabled the widespread use and application of flash memories anywhere a non-volatile memory function is required. However, in order to enable a reasonable write speed the ETOX cell uses channel hot electron injection, the erase operation which can be slower is achieved by Fowler-Nordhiem tunneling from the floating gate to the source. The large barriers to electron tunneling or hot electron injection presented by the silicon oxide-silicon interface, 3.2 eV, result in slow write and erase speeds even at very high electric fields. The combination of very high electric fields and damage by hot electron collisions in the oxide result in a number of operational problems like soft erase error, reliability problems of premature oxide breakdown and a limited number of cycles of write and erase.

Other approaches to resolve the above described problems include; the use of different floating gate materials, e.g. SiC, SiOC, GaN, and GaAIN, which exhibit a lower work function (see FIG. 1A), the use of structured surfaces which increase the localized electric fields (see FIG. 1B), and amorphous SiC gate insulators with larger electron affinity, $\chi$, to increase the tunneling probability and reduce erase time (see FIG. 1C).

One example of the use of different floating gate (FIG. 1A) materials is provided in U.S. Pat. No. 5,801,401 by L. Forbes, entitled "FLASH MEMORY WITH MICROCRYSTALLINE SILICON CARBIDE AS THE FLOATING GATE STRUCTURE." Another example is provided in U.S. Pat. No. 5,852,306 by L. Forbes, entitled "FLASH MEMORY WITH NANOCRYSTALLINE SILICON FILM AS THE FLOATING GATE." Still further examples of this approach are provided in pending applications by L. Forbes and K. Ahn, entitled "DYNAMIC RANDOM ACCESS MEMORY OPERATION OF A FLASH MEMORY DEVICE WITH CHARGE STORAGE ON A LOW ELECTRON AFFINITY GaN OR GaAIN FLOATING GATE," Ser. No. 08/908,098, and "VARIABLE ELECTRON AFFINITY DIAMOND-LIKE COMPOUNDS FOR GATES IN SILICON CMOS MEMORIES AND IMAGING DEVICES," Ser. No. 08/903,452.

An example of the use of the structured surface approach (FIG. 1B) is provided in U.S. Pat. No. 5,981,350 by J. Geusic, L. Forbes, and K. Y. Ahn, entitled "DRAM CELLS WITH A STRUCTURE SURFACE USING A SELF STRUCTURED MASK." Another example is provided in U.S. Pat. No. 6,025,627 by L. Forbes and J. Geusic, entitled "ATOMIC LAYER EXPITAXY GATE INSULATORS AND TEXTURED SURFACES FOR LOW VOLTAGE FLASH MEMORIES."

Finally, an example of the use of amorphous SiC gate insulators (FIG. 1C) is provided in U.S. patent application Ser. No. 08/903,453 by L. Forbes and K. Ahn, entitled "GATE INSULATOR FOR SILICON INTEGRATED CIRCUIT TECHNOLOGY BY THE CARBURIZATION OF SILICON."

Additionally, graded composition insulators to increase the tunneling probability and reduce erase time have been described by the same inventors. (See, L. Forbes and J. M. Eldridge, "GRADED COMPOSITION GATE INSULATORS TO REDUCE TUNNELING BARRIERS IN FLASH MEMORY DEVICES," application Ser. No. 10/610,996.

However, all of these approaches relate to increasing tunneling between the floating gate and the substrate such as is employed in a conventional ETOX device and do not involve tunneling between the control gate and floating gate through and inter-poly dielectric.

Therefore, there is a need in the art to provide improved programmable array type logic and/or memory devices while avoiding the large barriers to electron tunneling or hot electron injection presented by the silicon oxide-silicon interface, 3.2 eV, which result in slow write and erase speeds even at very high electric fields. There is also a need to avoid the combination of very high electric fields and damage by hot electron collisions in the which oxide result in a number of operational problems like soft erase error, reliability problems of premature oxide breakdown and a limited number of cycles of write and erase. Further, when using an interpoly dielectric insulator erase approach, the above mentioned problems of having a rough top surface on the polysilicon floating gate which results in, poor quality interpoly oxides, sharp points, localized high electric fields, premature breakdown and reliability problems must be avoided.

SUMMARY OF THE INVENTION

The above mentioned problems with programmable array type logic and/or memory devices and other problems are addressed by the present invention and will be understood by reading and studying the following specification. Systems and methods are provided for programmable array type logic and/or memory devices with asymmetrical, low tunnel barrier interpoly insulators.

In one embodiment of the present invention, a depletion mode non-volatile memory cell, or floating gate transistor, includes a first source/drain region and a second source/drain region separated by a channel region in a substrate. A floating gate opposes the channel region and is separated therefrom by a gate oxide. A control gate opposes the floating gate. The control gate is separated from the floating gate by an asymmetrical low tunnel barrier intergate insulator. The low tunnel barrier intergate insulator includes a metal oxide insulator selected from the group consisting of $Al_2O_3$, $Ta_2O_5$, $TiO_2$, $ZrO_2$, $Nb_2O_5$, $SrBi_2Ta_2O_3$, $SrTiO_3$, $PbTiO_3$, and $PbZrO_3$. The floating gate includes a polysilicon floating gate having a metal layer formed thereon in contact with the low tunnel barrier intergate insulator. And, the control gate includes a polysilicon control gate having a metal layer, having a different work function from the metal layer formed on the floating gate, formed thereon in contact with the low tunnel barrier intergate insulator.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIG. 10 is a table which illustrates that there are many stable, crystalline metal oxides whose compositions can vary over at least small compositional ranges.

FIG. 11 is a table which illustrates that work function values can vary considerably, depending on the metal and measurement method.

FIG. 12 illustrates a hypothetical metal-oxide (M-O) phase diagram according to the teachings of the present invention.

FIGS. 13A–13C illustrate the compositional profiles for the asymmetrical low tunnel barrier intergate insulators according to the teachings of the present invention.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above.

Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1A:
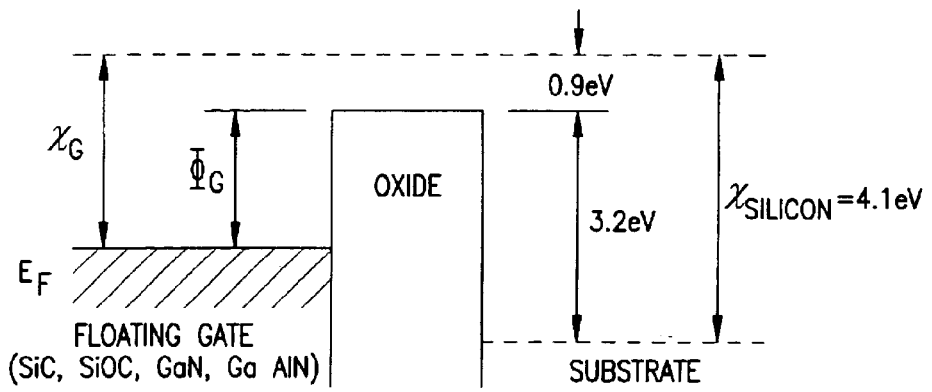
FIGS. 1A–1C illustrate a number of previous methods for reducing tunneling barriers in Flash memory.
Figure 1B:
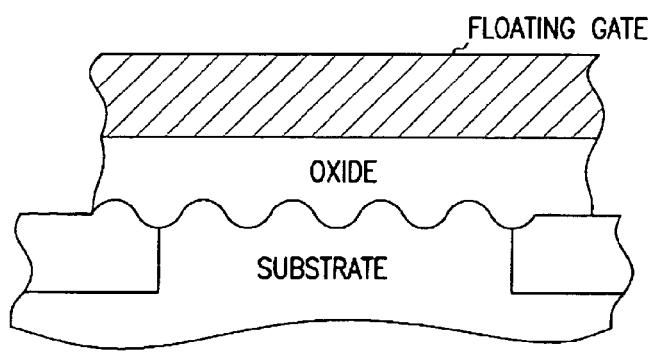
Figure 1C:
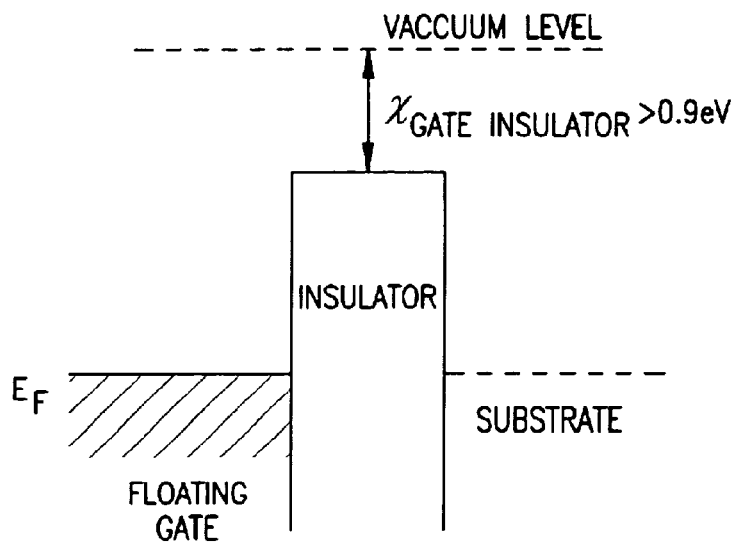
Figure 2:
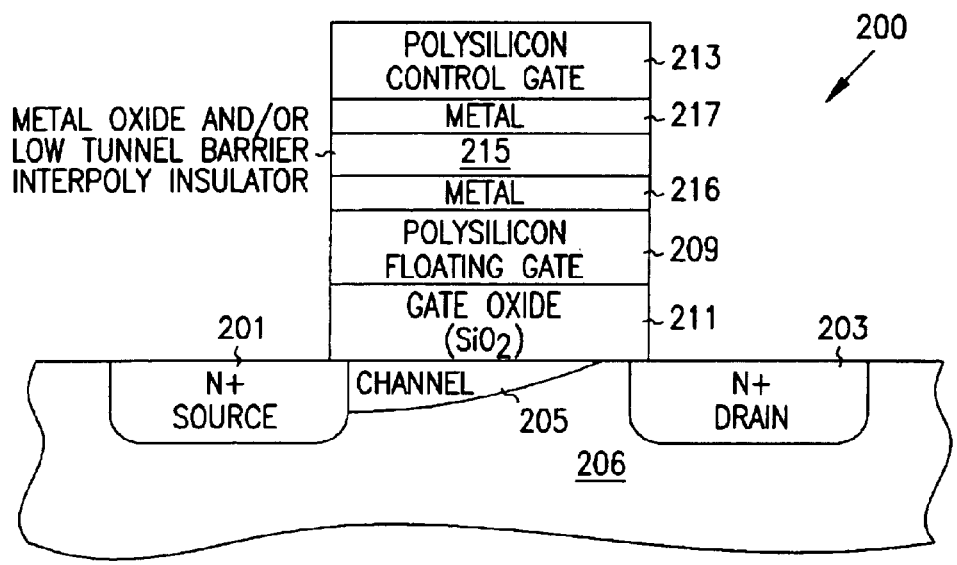
FIG. 2 illustrates one embodiment of a floating gate transistor, or non-volatile memory cell, according to the teachings of the present invention.

The present invention, describes the use of asymmetrical metal oxide interpoly dielectric insulators between the control gate and the floating gate of depletion mode non-volatile memory cells. An example is shown in FIG. 2 for a planar structure, or horizontal depletion mode non-volatile memory cell. This non-volatile memory cell, as described herein, can then be implemented in a number of programmable array type logic and/or memory devices according to the teachings of the present invention.

According to the teachings of the present invention. The use of an asymmetrical metal oxide films for this purpose offer a number of advantages including:

(i) Flexibility in selecting a range of smooth metal film surfaces and compositions that can be oxidized to form tunnel barrier insulators.

(ii) Employing simple "low temperature oxidation" to produce oxide films of highly controlled thickness, composition, purity and uniformity.

(iii) Avoiding inadvertent inter-diffusion of the metal and silicon as well as silicide formation since the oxidation can be carried out at such low temperatures.

(iv) Using metal oxides that provide desirably lower tunnel barriers, relative to barriers currently used such as $SiO_2$.

(v) Providing a wide range of higher dielectric constant oxide films with improved capacitance characteristics.

(vi) Providing a unique ability to precisely tailor tunnel oxide barrier properties for various device designs and applications.

(vii) Permitting the use of thicker tunnel barriers, if needed, to enhance device performance and its control along with yield and reliability.

(viii) Developing layered oxide tunnel barriers by oxidizing layered metal film compositions in order, for example, to enhance device yields and reliability more typical of single insulating layers.

(ix) Eliminating soft erase errors caused by the current technique of tunnel erase from floating gate to the source.

FIG. 2 illustrates one embodiment of a depletion mode floating gate transistor, or depletion mode non-volatile memory cell 200, according to the teachings of the present invention. The device works in the depletion mode and thus is normally on or conducts under zero or negative applied gate voltages. As shown in FIG. 2, the depletion mode non-volatile memory cell 200 includes a first source/drain region 201 and a second source/drain region 203 separated by a channel region 205 in a substrate 206. A floating gate 209 opposes the channel region 205 and is separated therefrom by a gate oxide 211. A control gate 213 opposes the floating gate 209. According to the teachings of the present invention, the control gate 213 is separated from the floating gate 209 by an asymmetrical low tunnel barrier intergate insulator 215.

In one embodiment of the present invention, the asymmetrical low tunnel barrier intergate insulator 215 includes an asymmetrical metal oxide insulator which is aluminum oxide ($A_2O_3$). In an alternative embodiment of the present invention, the asymmetrical low tunnel barrier intergate insulator 215 includes an asymmetrical transition metal oxide selected from the group consisting of $Ta_2O_5$, $TiO_2$, $ZrO_2$, and $Nb_2O_5$. In still another alternative embodiment of the present invention, the asymmetrical low tunnel barrier intergate insulator 215 includes an asymmetrical Perovskite oxide tunnel barrier selected from the group consisting of $SrBi_2Ta_2O_3$, $SrTiO_3$, $PbTiO_3$, and $PbZrO_3$.

According to the teachings of the present invention, the floating gate 209 includes a polysilicon floating gate 209 having a metal layer 216 formed thereon in contact with the asymmetrical low tunnel barrier intergate insulator 215. Likewise, the control gate 213 includes a polysilicon control gate 213 having a metal layer 217, having a work function different from the metal layer 216 formed on the floating gate 209, formed thereon in contact with the asymmetrical low tunnel barrier intergate insulator 215. In one embodiment, metal layer 216 is formed of the same metal material used to form the asymmetrical metal oxide interpoly insulator 215. As stated above, the depletion mode non-volatile memory cell, as described herein, can then be implemented in a number of programmable array type logic and/or memory devices according to the teachings of the present invention.

Figure 3:
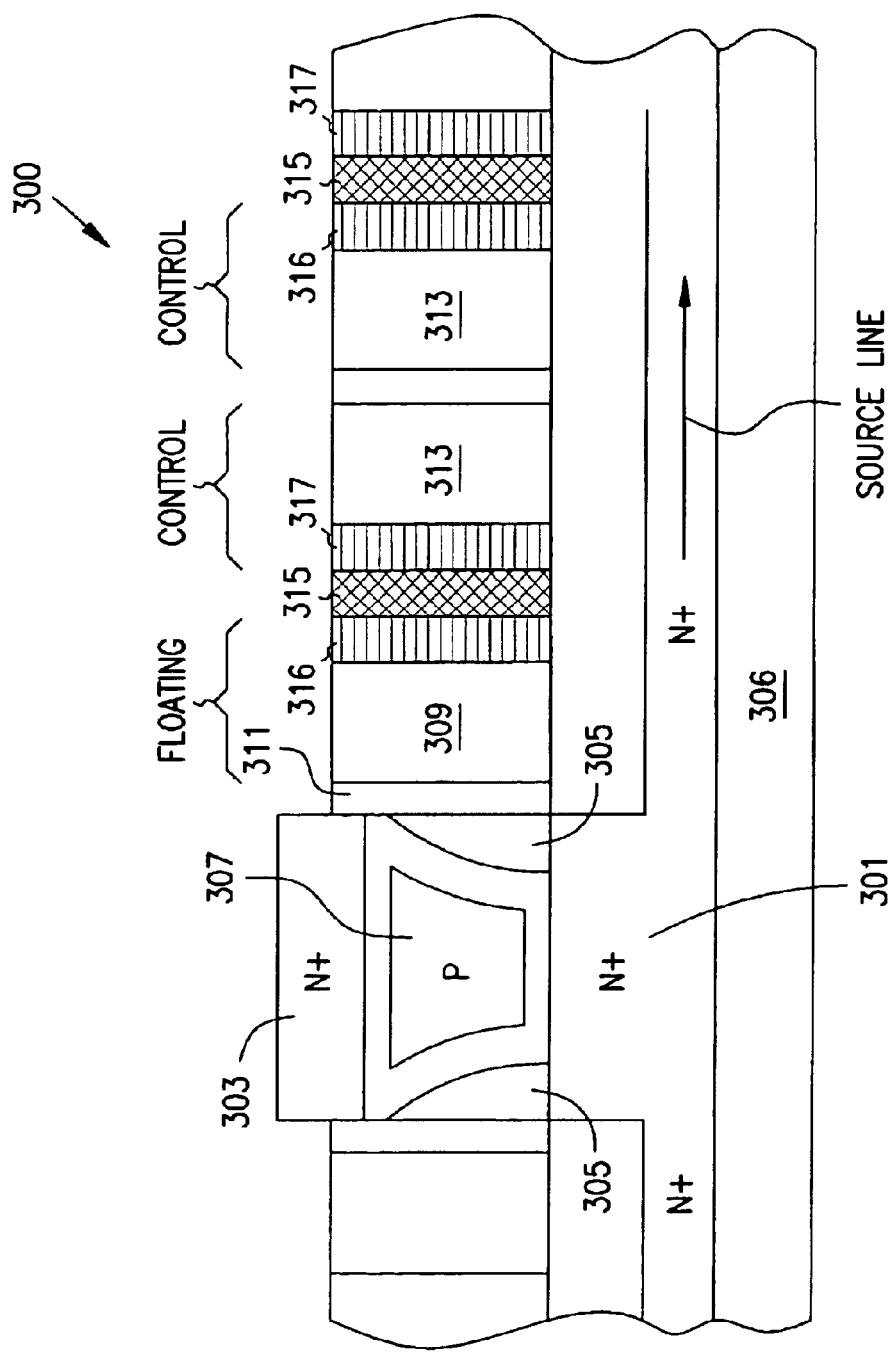
FIG. 3 illustrates another embodiment of a floating gate transistor, or non-volatile memory cell, according to the teachings of the present invention.

FIG. 3 illustrates another embodiment of a depletion mode floating gate transistor, or depletion mode non-volatile memory cell 300, according to the teachings of the present invention. As shown in the embodiment of FIG. 3, the depletion mode non-volatile memory cell 300 includes a vertical depletion mode non volatile memory cell 300. In this embodiment, the non-volatile memory cell 300 has a first source/drain region 301 formed on a substrate 306. A body region 307 including a channel region 305 is formed on the first source/drain region 301. A second source/drain region 303 is formed on the body region 307. Methods for forming such a vertical transistor structure are disclosed in U.S. Pat. No. 6,135,175, entitled "Memory Address Decode Array with vertical transistors, which is incorporated herein by reference. A floating gate 309 opposes the channel region 305 and is separated therefrom by a gate oxide 311. A control gate 313 opposes the floating gate 309. According to the teachings of the present invention, the control gate 313 is separated from the floating gate 309 by an asymmetrical low tunnel barrier intergate insulator 315.

In one embodiment of the present invention, low tunnel barrier intergate insulator 315 includes an asymmetrical metal oxide insulator which is aluminum oxide ($Al_2O_3$). In an alternative embodiment of the present invention, the asymmetrical low tunnel barrier intergate insulator 315 includes an asymmetrical transition metal oxide selected from the group consisting of $Ta_2O_5$, $TiO_2$, $ZrO_2$, and $Nb_2O_5$. In still another alternative embodiment of the present invention, the low tunnel barrier intergate insulator 315 includes an asymmetrical Perovskite oxide tunnel barrier selected from the group consisting of $SrBi_2Ta_2O_3$, $SrTiO_3$, $PbTiO_3$, and $PbZrO_3$.

The floating gate 309 includes a polysilicon floating gate 309 having a metal layer 316 formed thereon in contact with the asymmetrical low tunnel barrier intergate insulator 315. The control gate 313 includes a polysilicon control gate 313 having a metal layer 317, having a work function different from the metal layer 316 formed on the floating gate 309, formed thereon in contact with the asymmetrical low tunnel barrier intergate insulator 315. As stated above, the depletion mode non-volatile memory cell, as described herein, can then be implemented in a number of programmable array type logic and/or memory devices according to the teachings of the present invention.

As shown in FIG. 3, the floating gate 309 includes a vertical floating gate 309 formed alongside of the body region 307. In the embodiment shown in FIG. 3, the control gate 313 includes a vertical control gate 313 formed alongside of the vertical floating gate 309.

As will be explained in more detail below, the floating gate 309 and control gate 313 orientation shown in FIG. 3 is just one embodiment for a vertical non volatile memory cell 300, according to the teachings of the present invention. In other embodiments, explained below, the floating gate includes a horizontally oriented floating gate formed alongside of the body region. In this alternative embodiment, the control gate includes a horizontally oriented control gate formed above the horizontally oriented floating gate.

Figure 4:
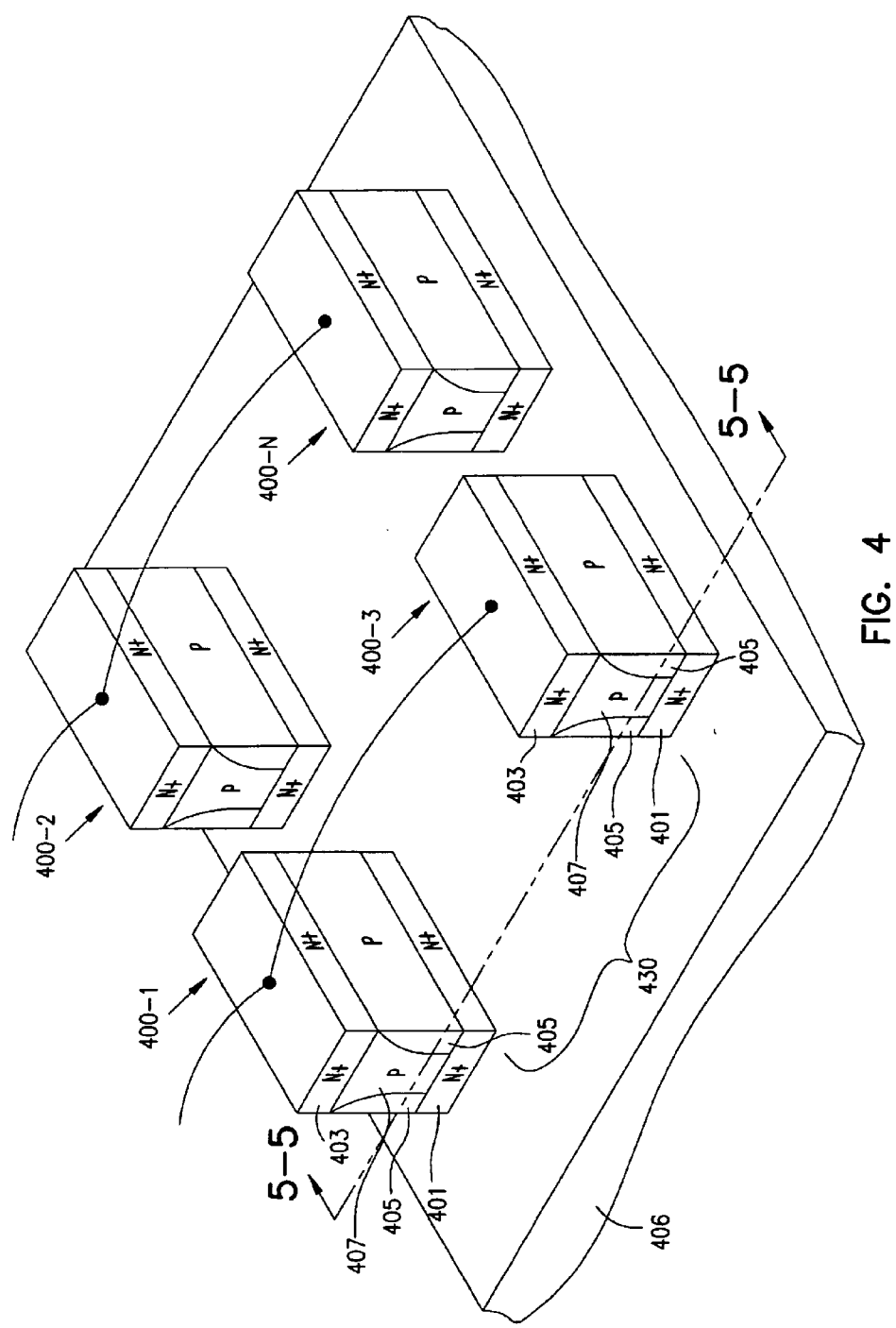
FIG. 4 is a perspective view illustrating an array of silicon pillars formed on a substrate as used in one embodiment according to the teachings of the present invention.

FIG. 4 is a perspective view illustrating an array of silicon pillars 400-1, 400-2, 400-3, ..., 400-N, formed on a substrate 406 as used in one embodiment according to the teachings of the present invention. As will be understood by one of ordinary skill in the art upon reading this disclosure, the substrates can be (i) conventional p-type bulk silicon or p-type epitaxial layers on p+ wafers, (ii) silicon on insulator formed by conventional SIMOX, wafer bonding and etch back or silicon on sapphire, or (iii) small islands of silicon on insulator utilizing techniques such as described in more detail in U.S. Pat. No. 5,691,230, by Leonard Forbes, entitled "Technique for Producing Small Islands of Silicon on Insulator," issued Nov. 25, 1997, which is incorporated herein by reference.

As shown in FIG. 4, each pillar in the array of silicon pillars 400-1, 400-2, 400-3, ..., 400-N, includes a first source/drain region 401 and a second source/drain region 403. The first and the second source/drain regions, 401 and 403, are separated by a body region 407 including channel regions 405. As shown in FIG. 4, a number of trenches 430 separate adjacent pillars in the array of silicon pillars 400-1, 400-2, 400-3, ..., 400-N. Trenches 430 are referenced in connection with the discussion which follows in connection with FIGS. 5A–5E.

Figure 5A:
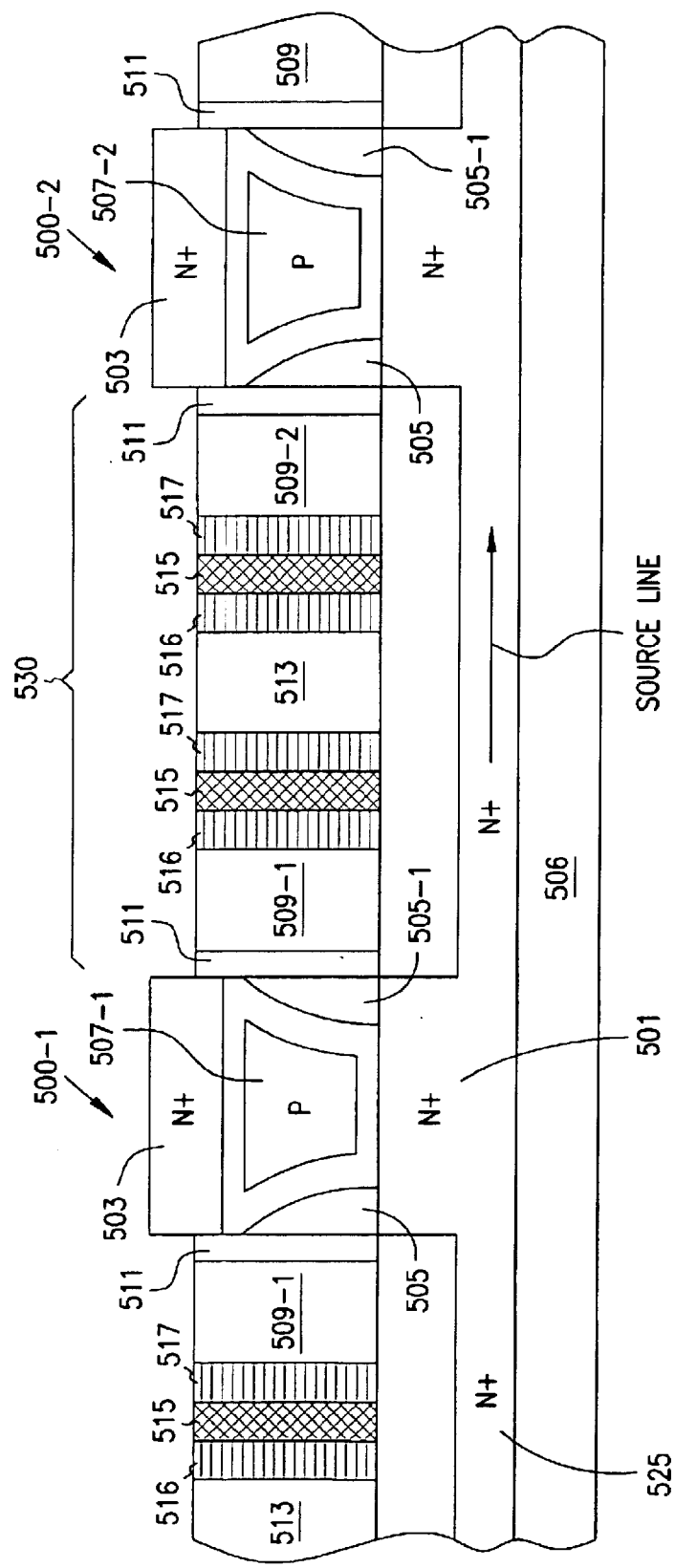
FIGS. 5A–5E are cross sectional views taken along cut line 5—5 from FIG. 4 illustrating a number of floating gate and control gate configurations which are included in the scope of the present invention.

FIGS. 5A–5E are cross sectional views taken along cut line 5—5 from FIG. 4. As mentioned above in connection with FIG. 3, a number of floating gate and control gate configurations are included in the present invention. FIG. 5A illustrates one such embodiment of the present invention. FIG. 5A illustrates a first source/drain region 501 and second source/drain region 503 for a non-volatile memory cell 500 formed according to the teachings of the present invention. As shown in FIG. 5, the first and second source/drain regions, 501 and 503, are contained in a pillar of semiconductor material, and separated by a body region 507 including channel regions 505. As shown in the embodiments of FIGS. 5A–5E, the first source/drain region 501 is integrally connected to a buried sourceline 525. As one or ordinary skill in the art will understand upon reading this disclosure the buried sourceline 525 is be formed of semiconductor material which has the same doping type as the first source/drain region 501. In one embodiment, the sourceline 525 is formed of semiconductor material of the same doping as the first source/drain region 501, but is more heavily doped than the first source/drain region 501.

As shown in the embodiment of FIG. 5A, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In this embodiment, a single control gate 513 is shared by the pair of floating gates 509-1 and 509-2 on opposing sides of the trench 530. As one of ordinary skill in the art will understand upon reading this disclosure, the shared single control gate 513 can include an integrally formed control gate line. As shown in FIG. 5A, such an integrally formed control gate line 513 can be one of a plurality of control gate lines which are each independently formed in the trench, such as trench 530, below the top surface of the pillars 500-1 and 500-2 and between the pair of floating gates 509-1 and 509-2. In one embodiment, according to the teachings of the present invention, each floating gate, e.g. 509-1 and 509-2, includes a vertically oriented floating gate having a vertical length of less than 100 nanometers.

Figure 5B:
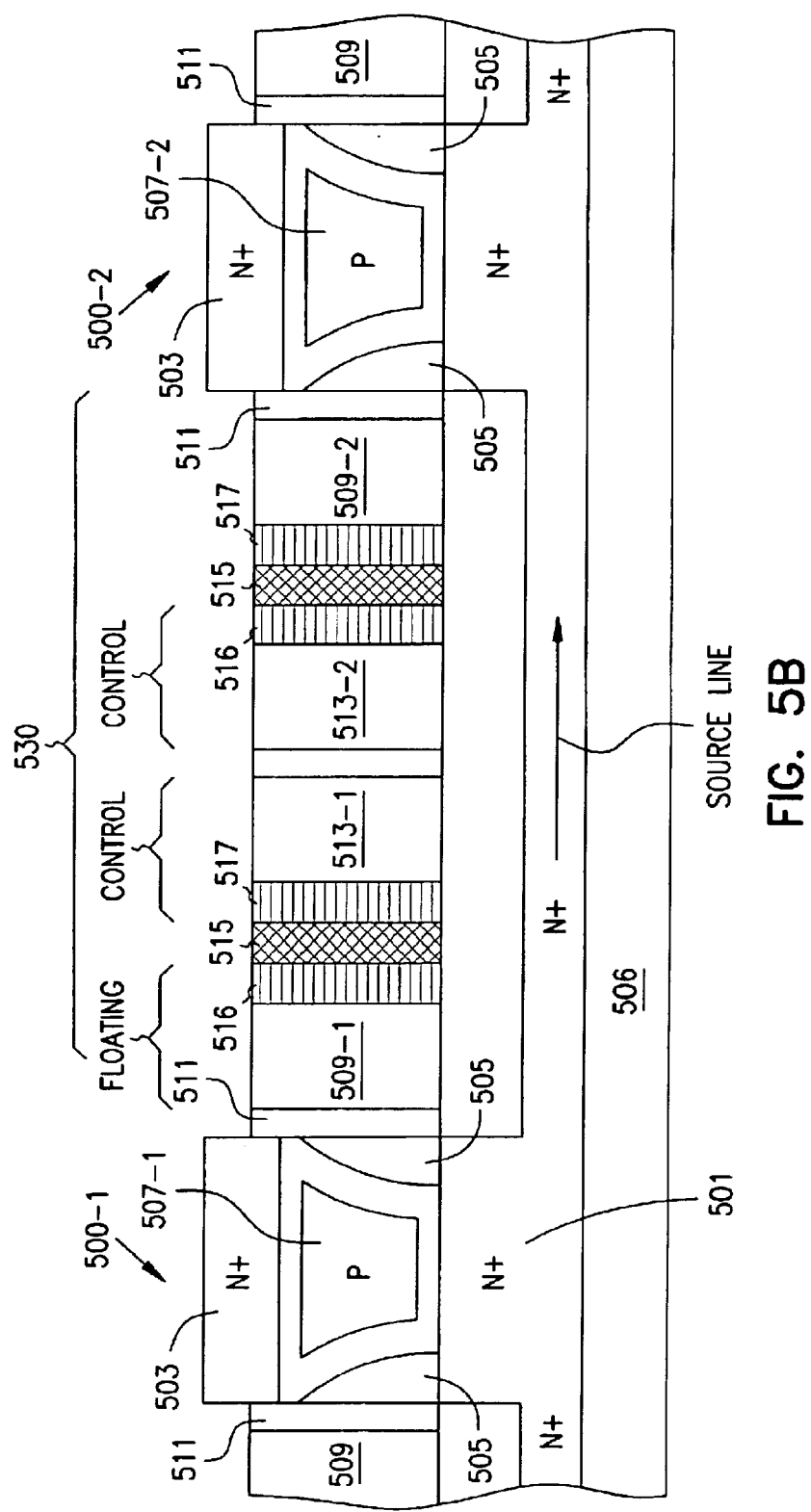

As shown in the embodiment of FIG. 5B, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5B, a plurality of control gate lines are again formed in trenches, e.g. trench 530, below the top surface of the pillars, 500-1 and 500-2, and between the pair of floating gates 509-1 and 509-2. However, in this embodiment, each trench, e.g. 530, houses a pair of control gate lines, shown as 513-1 and 513-2. Each one of the pair of control gate lines 513-1 and 513-2 addresses the floating gates, 509-1 and 509-2 respectively, on opposing sides of the trench 530. In this embodiment, the pair of control gate lines, or control gates 513-1 and 513-2 are separated by an insulator layer.

Figure 5C:
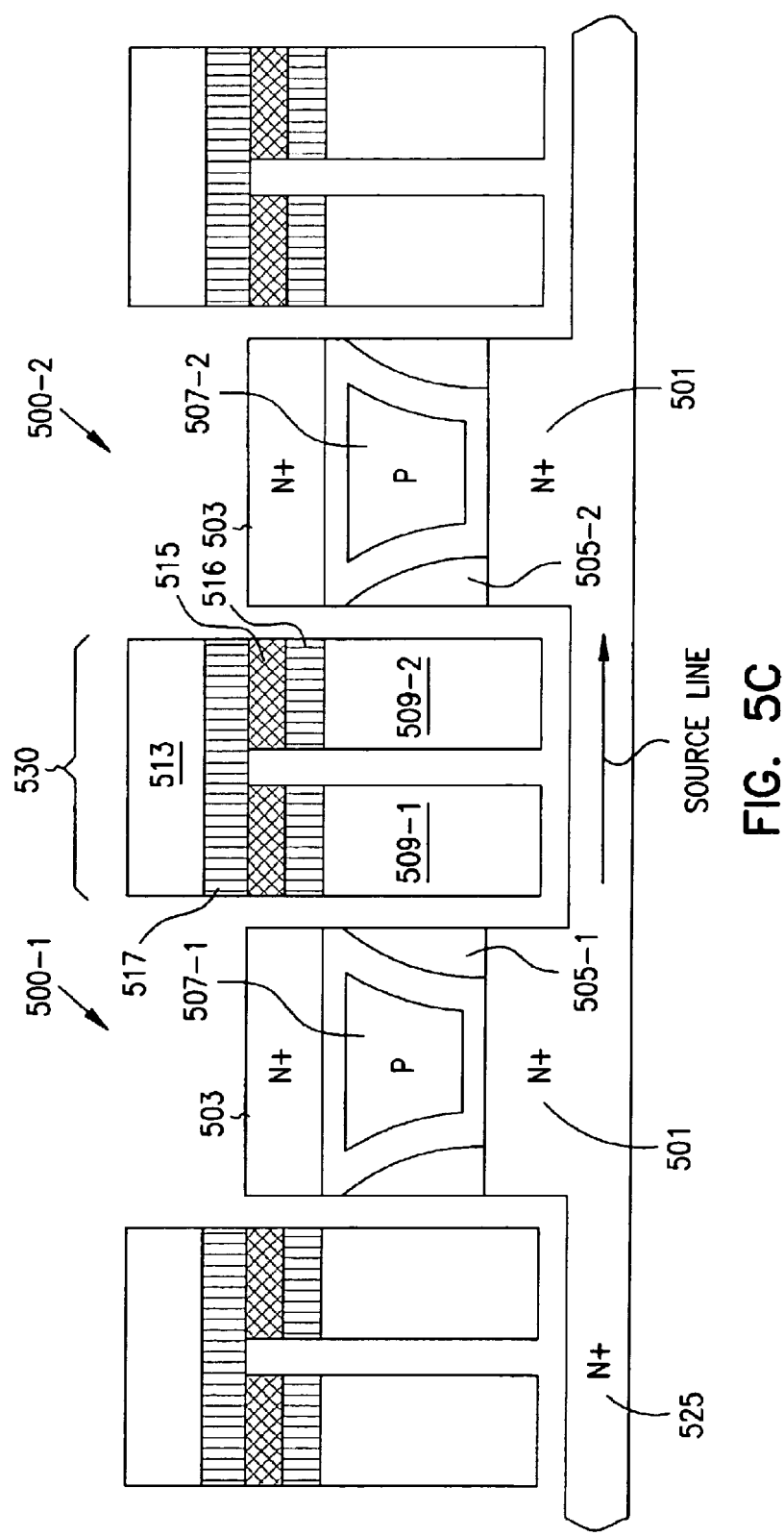

As shown in the embodiment of FIG. 5C, a pair of floating gates 509-1 and 509-2 are again formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5C, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. In the embodiment of FIG. 5C, each pair of floating gates, e.g. 509-1 and 509-2, in a given trench shares a single control gate line, or control gate 513.

Figure 5D:
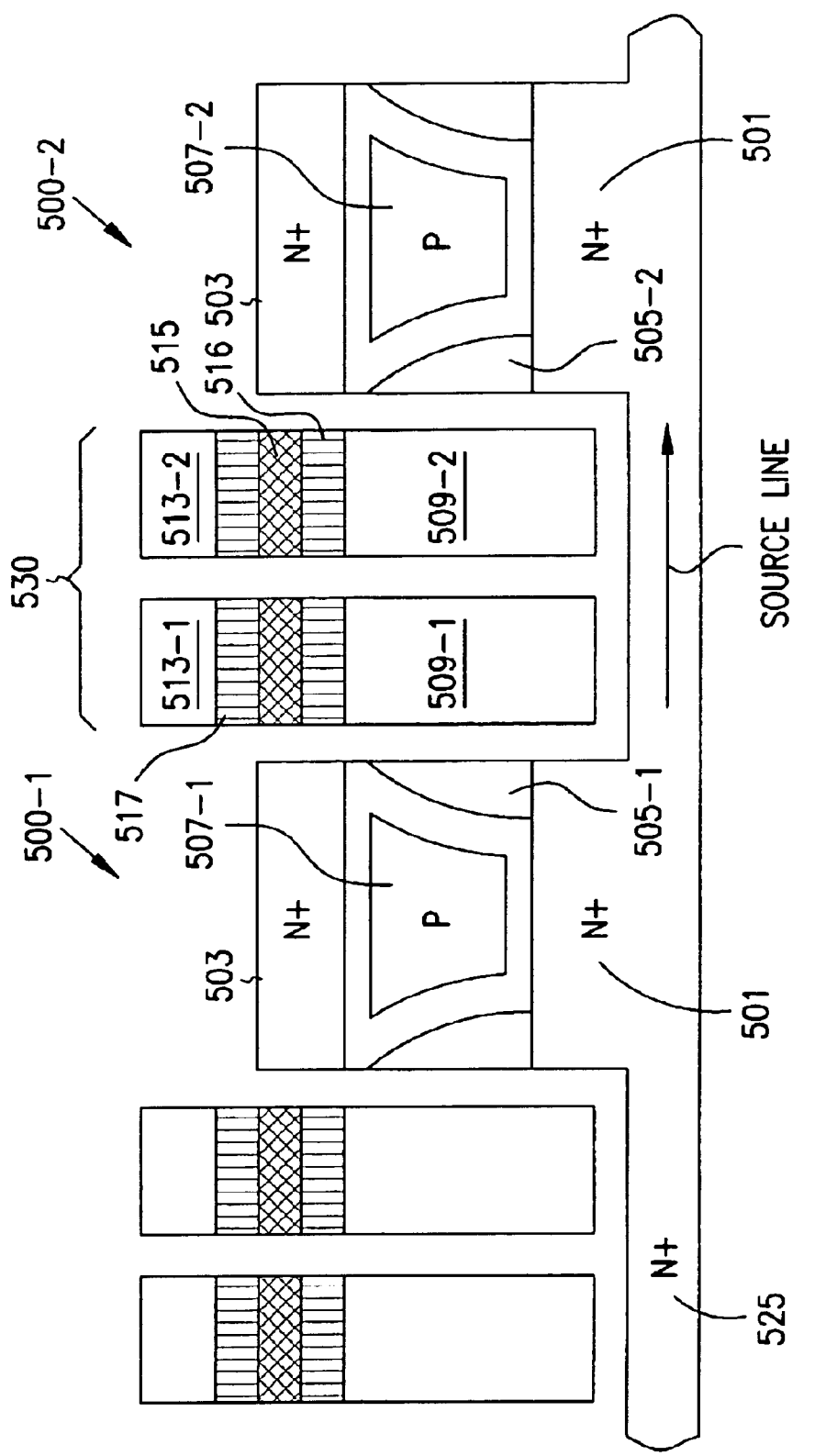

As shown in the embodiment of FIG. 5D, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5D, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. However, in the embodiment of FIG. 5D, each one of the pair of floating gates, e.g. 509-1 and 509-2, is addressed by an independent one of the plurality of control lines or control gates, shown in FIG. 5D as 513-1 and 513-2.

Figure 5E:
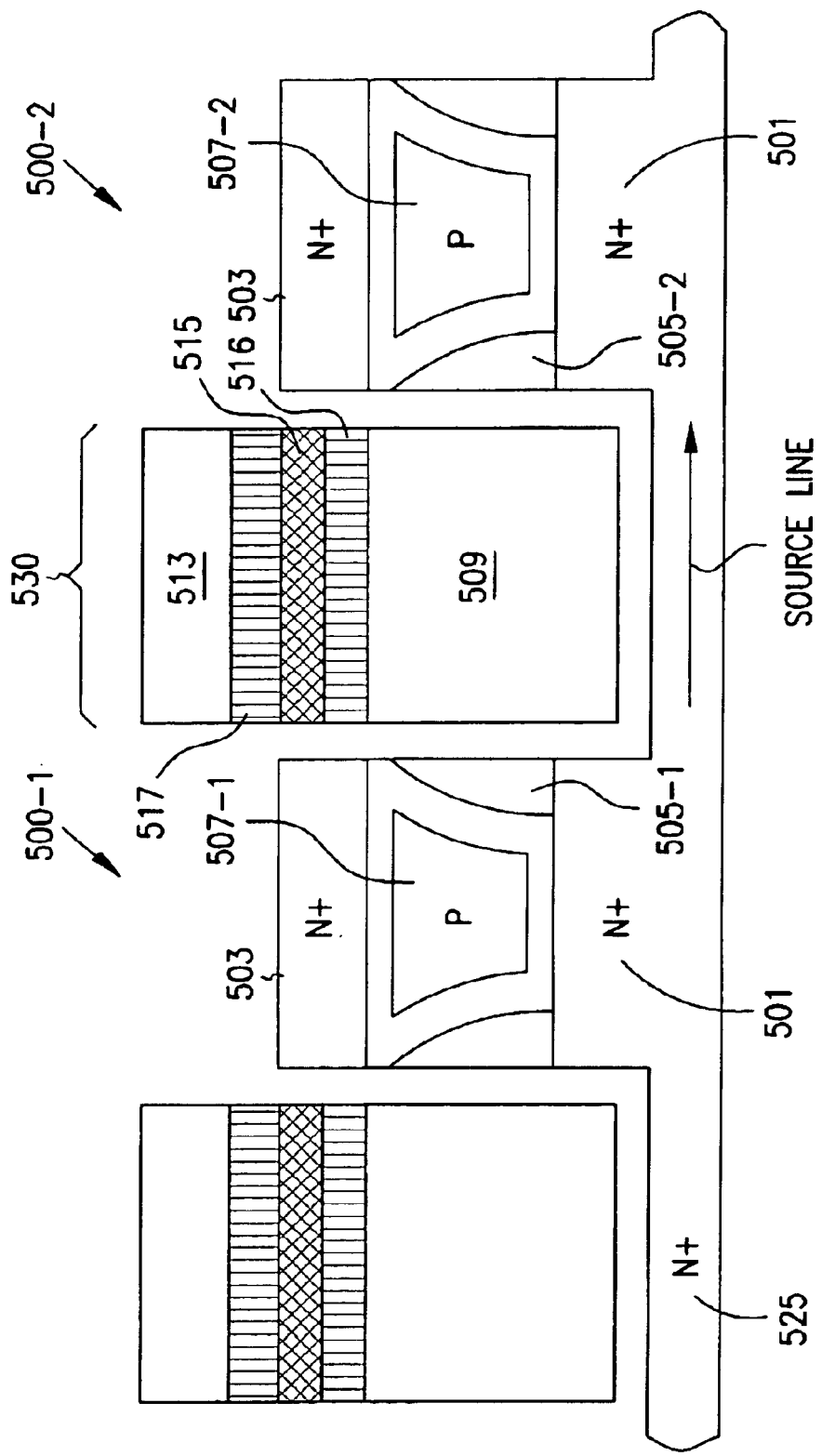

As shown in the embodiment of FIG. 5E, a single floating gate 509 is formed in each trench 530 between adjacent pillars which form memory cells 500-1 and 500-2. According to the teachings of the present invention, the single floating gate 509 can be either a vertically oriented floating gate 509 or a horizontally oriented floating gate 509 formed by conventional processing techniques, or can be a horizontally oriented floating gate 509 formed by a replacement gate technique such as described in a copending application, entitled "Flash Memory with Ultrathin Vertical Body Transistors," by Leonard Forbes and Kie Y. Ahn, application Ser. No. 09/780,169. In one embodiment of the present invention, the floating gate 509 has a vertical length facing the body region 505 of less than 100 nm. In another embodiment, the floating gate 509 has a vertical length facing the body region 505 of less than 50 nm. In one embodiment, as shown in FIG. 5E, the floating gate 509 is shared, respectively, with the body regions 507-1 and 507-2, including channel regions 505-1 and 505-2, in adjacent pillars 500-1 and 500-2 located on opposing sides of the trench 530. In one embodiment, the control gate 513 includes a horizontally oriented control gate 513 formed above the horizontally oriented floating gate 509.

As one of ordinary skill in the art will understand upon reading this disclosure, in each of the embodiments described above in connection with FIGS. 5A–5E the floating gates 509 are separated from the control gate lines, or control gates 513 with an asymmetrical low tunnel barrier intergate insulator in accordance with the descriptions given above in connection with FIG. 3. The modifications here are to use tunneling through the interpoly dielectric to realize flash memory devices. The vertical devices include an extra flexibility in that the capacitors, e.g. gate oxide and intergate insulator, are easily fabricated with different areas. This readily allows the use of very high dielectric constant inter-poly dielectric insulators with lower tunneling barriers.

Figure 6A:
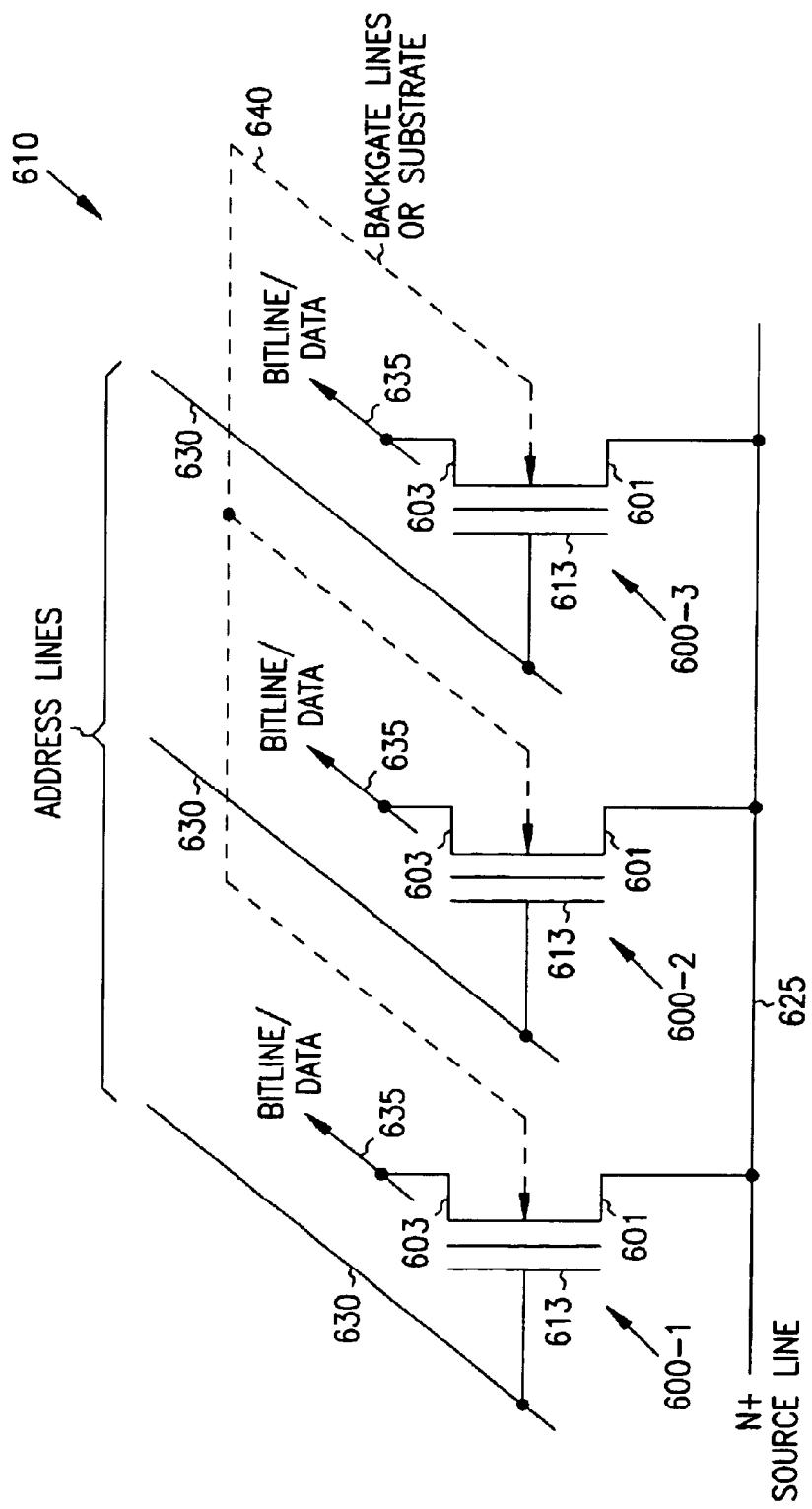
FIGS. 6A–6D illustrate a number of address coincidence schemes can be used together with the present invention.

FIGS. 6A–6D illustrate that a number of address coincidence schemes can be used together with the present invention. FIG. 6A illustrates a NOR flash memory array 610 having a number of non-volatile memory cells 600-1, 600-2, 600-3, using a coincidence address array scheme. For purposes of illustration, FIG. 6A shows a sourceline 625 coupled to a first source/drain region 601 in each of the number of non-volatile memory cells 600-1, 600-2, 600-3. The sourceline is shown oriented in a first selected direction in the flash memory array 610. In FIG. 6A, a number of control gate lines 630 are shown oriented in a second selected direction in the flash memory array 610. As shown in FIG. 6A, the number of control gate lines 630 are coupled to, or integrally formed with the control gates 613 for the number of non-volatile memory cells 600-1, 600-2, 600-3. As shown in FIG. 6A, the second selected direction is orthogonal to the first selected direction. Finally, FIG. 6A shows a number of bitlines 635 oriented in a third selected direction in the flash memory array 610. As shown in FIG. 6A, the number of bitlines are coupled to the second source/drain regions in the number of non-volatile memory cells 600-1, 600-2, 600-3. In the embodiment shown in FIG. 6A the third selected direction is parallel to the second selected direction and the number of control gate lines 630 serve as address lines. Also, as shown in FIG. 6A, the flash memory array 610 includes a number of backgate or substrate/well bias address lines 640 coupled to the substrate.

Figure 6B:
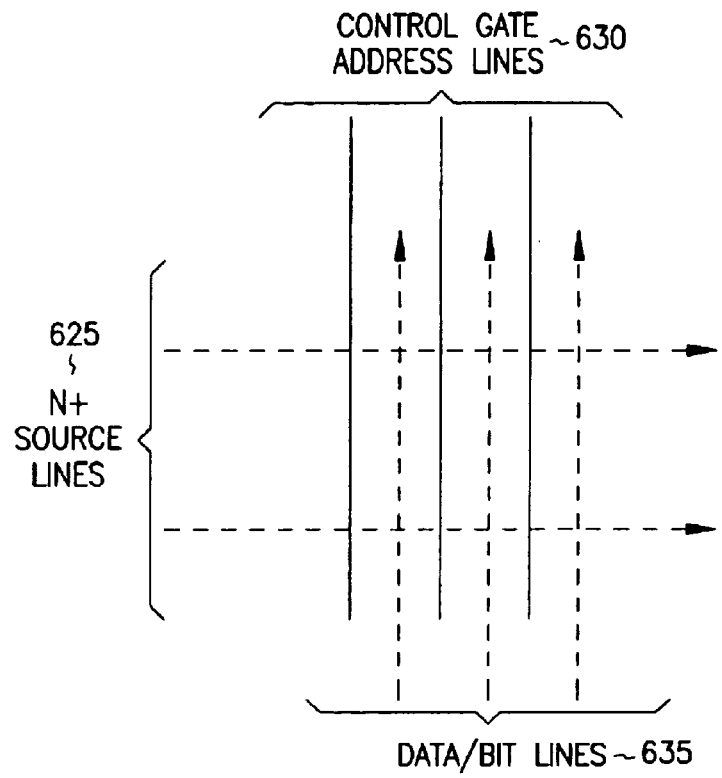
Figure 6C:
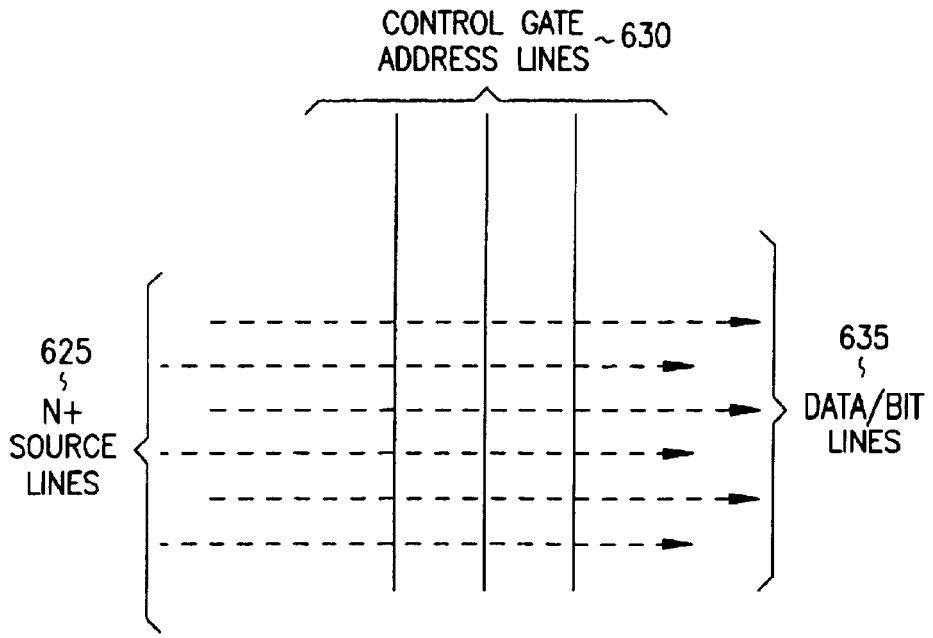
Figure 6D:
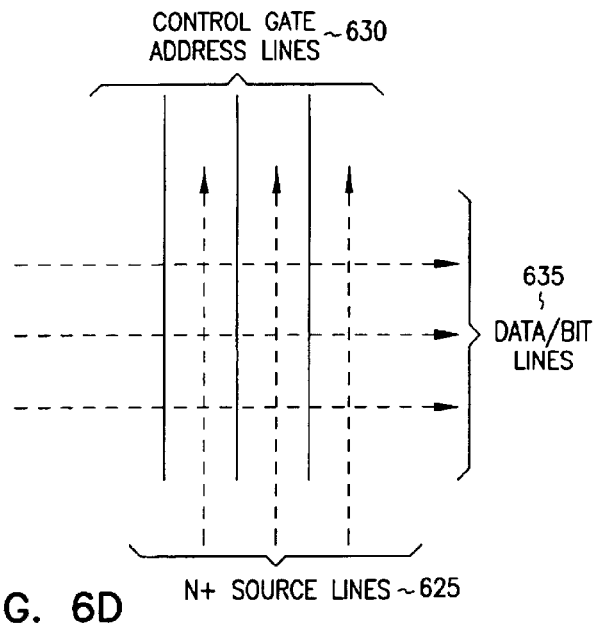

Using FIG. 6A as a reference point, FIGS. 6B–6D illustrate of top view for three different coincidence address scheme layouts suitable for use with the present invention. First, FIG. 6B provides the top view layout of the coincidence address scheme described in connection with FIG. 6A. That is, FIG. 6B illustrates a number of sourcelines 625 oriented in a first selected direction, a number of control gate lines 630 oriented in a second selected direction, and a number of bitlines 635 oriented in a third selected direction for the flash memory array 600. As explained above in connection with FIG. 6A, in this embodiment, the second and third selected direction are parallel to one another and orthogonal to the first selected direction such that the number of control gate lines 630 serve as address lines.

FIG. 6C provides the top view layout of another coincidence address scheme according to the teachings of the present invention. This is, FIG. 6C illustrates a number of sourcelines 625 oriented in a first selected direction, a number of control gate lines 630 oriented in a second selected direction, and a number of bitlines 635 oriented in a third selected direction for the flash memory array 600. In the embodiment of FIG. 6C, the first selected direction and the third selected direction are parallel to one another and orthogonal to the second selected direction. In this embodiment, the number of control gate lines 630 again serve as address lines.

FIG. 6D provides the top view layout of yet another coincidence address scheme according to the teachings of the present invention. This is, FIG. 6D illustrates a number of sourcelines 625 oriented in a first selected direction, a number of control gate lines 630 oriented in a second selected direction, and a number of bitlines 635 oriented in a third selected direction for the flash memory array 600. In the embodiment of FIG. 6D, the first selected direction and the second selected direction are parallel to one another and orthogonal to the third selected direction. In this embodiment, the number of bitlines 635 serve as address lines.

As will be apparent to one of ordinary skill in the art upon reading this disclosure, and as will be described in more detail below, write can still be achieved by hot electron injection and/or, according to the teachings of the present invention, tunneling from the control gate to the floating gate. According to the teachings of the present invention, block erase is accomplished by driving the control gates with a relatively large positive voltage and tunneling from the metal on top of the floating gate to the metal on the bottom of the control gate.

Figure 7A:
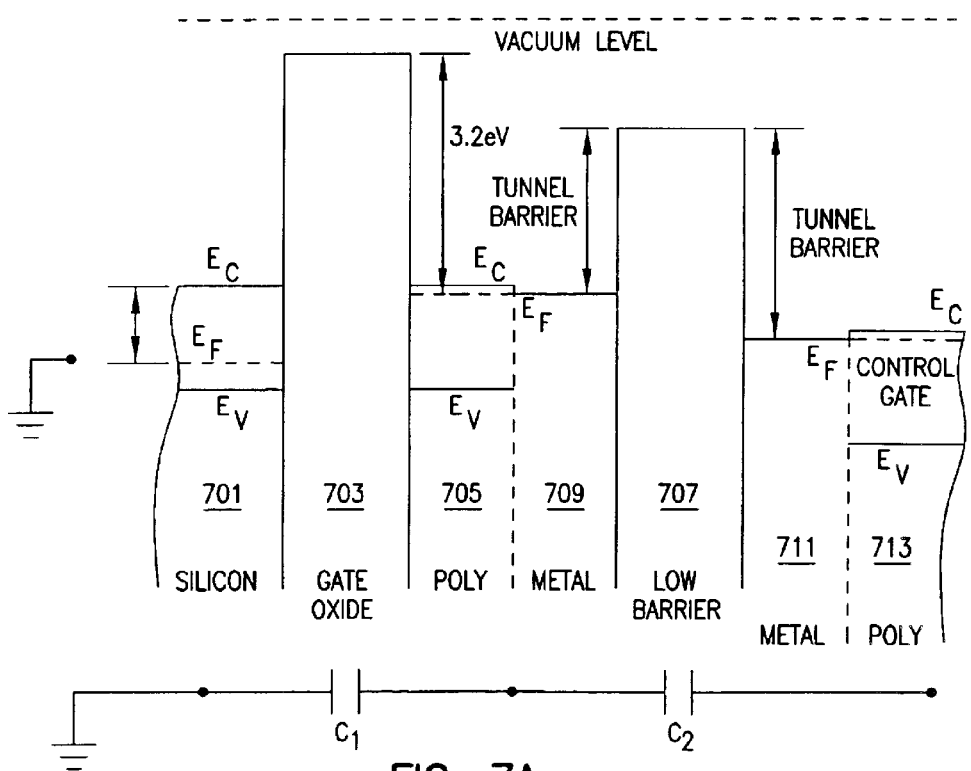
FIG. 7A is an energy band diagram illustrating the band structure at vacuum level with the low tunnel barrier interpoly insulator according to the teachings of the present invention.

FIG. 7A is an energy band diagram illustrating the band structure at vacuum level with the asymmetrical low tunnel barrier interpoly insulator according to the teachings of the present invention. FIG. 7A is useful in illustrating the reduced tunnel barrier off of the floating gate to the control gate and for illustrating the respective capacitances of the structure according to the teachings of the present invention.

FIG. 7A shows the band structure of the silicon substrate, e.g. channel region 701, silicon dioxide gate insulator, e.g. gate oxide 703, polysilicon floating gate 705, the asymmetrical low tunnel barrier interpoly dielectric 707, between metal plates 709 and 711, and then the polysilicon control gate 713, according to the teachings of the present invention.

The design considerations involved are determined by the dielectric constant, thickness and tunneling barrier height of the asymmetrical interpoly dielectric insulator 707 relative to that of the silicon dioxide gate insulator, e.g. gate oxide 703. The tunneling probability through the interpoly dielectric 707 is an exponential function of both the barrier height and the electric field across this dielectric.

Figure 7B:
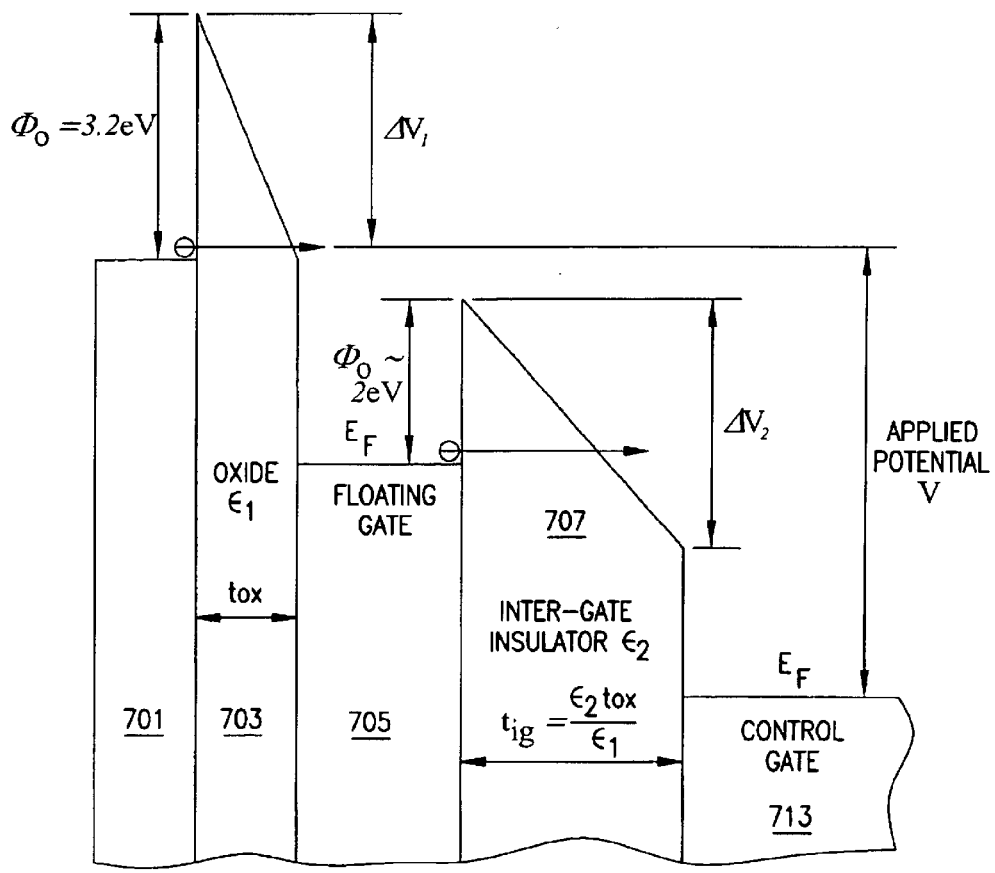
FIG. 7B is an energy band diagram illustrating the band structure during an erase operation of electrons from the floating gate to the control gate across the low tunnel barrier interpoly insulator according to the teachings of the present invention.

FIG. 7B is an energy band diagram illustrating the band structure during an erase operation of electrons from the floating gate 705 to the control gate 713 across the low tunnel barrier interpoly insulator 707 according to the teachings of the present invention. FIG. 7B is similarly useful in illustrating the reduced tunnel barrier off of the floating gate 705 to the control gate 713 and for illustrating the respective capacitances of the structure according to the teachings of the present invention.

As shown in FIG. 7B, the electric field is determined by the total voltage difference across the structure, the ratio of the capacitances (see FIG. 7A), and the thickness of the asymmetrical interpoly dielectric 707. The voltage across the asymmetrical interpoly dielectric 707 will be, $\Delta V2=V \cdot C1/(C1+C2)$, where V is the total applied voltage. The capacitances, C, of the structures depends on the dielectric constant, $\epsilon_r$, the permittivity of free space, $\epsilon_o$, and the thickness of the insulating layers, t, and area, A, such that $C=\epsilon_r\epsilon_o A/t$, Farads/cm$^2$, where $\epsilon_r$ is the low frequency dielectric constant. The electric field across the asymmetrical interpoly dielectric insulator 707, having capacitance, C2, will then be $E2=\Delta V2/t2$, where t2 is the thickness of this layer.

The tunneling current in erasing charge from the floating gate 705 by tunneling to the control gate 713 will then be as shown in FIG. 7B given by an equation of the form:

$$J=B\ \exp(-Eo/E)$$

where E is the electric field across the interpoly dielectric insulator 707 and Eo depends on the barrier height. Practical values of current densities for aluminum oxide which has a current density of 1 A/cm$^2$ at a field of about $E=1V/20\ \text{Å}=5\times10^{+6}$ V/cm are evidenced in a description by Pollack. (See generally, S. R. Pollack and C. E. Morris, "Tunneling through gaseous oxidized films of Al$_2$O$_3$," Trans. AIME, Vol. 233, p. 497, 1965). Practical current densities for silicon oxide transistor gate insulators which has a current density of 1 A/cm$^2$ at a field of about $E=2.3V/23\text{Å}=1\times10^{+7}$ V/cm are evidenced in a description by T. P. Ma et al. (See generally, T. P. Ma et al., "Tunneling leakage current in ultrathin (<4 mm) nitride/oxide stack dielectrics," IEEE Electron Device Letters, vol. 19, no. 10, pp. 388–390, 1998).

The lower electric field in the aluminum oxide interpoly insulator 707 for the same current density reflects the lower tunneling barrier of approximately 2 eV, shown in FIG. 7B, as opposed to the 3.2 eV tunneling barrier of silicon oxide 703, also illustrated in FIG. 7B.

Figure 7C:
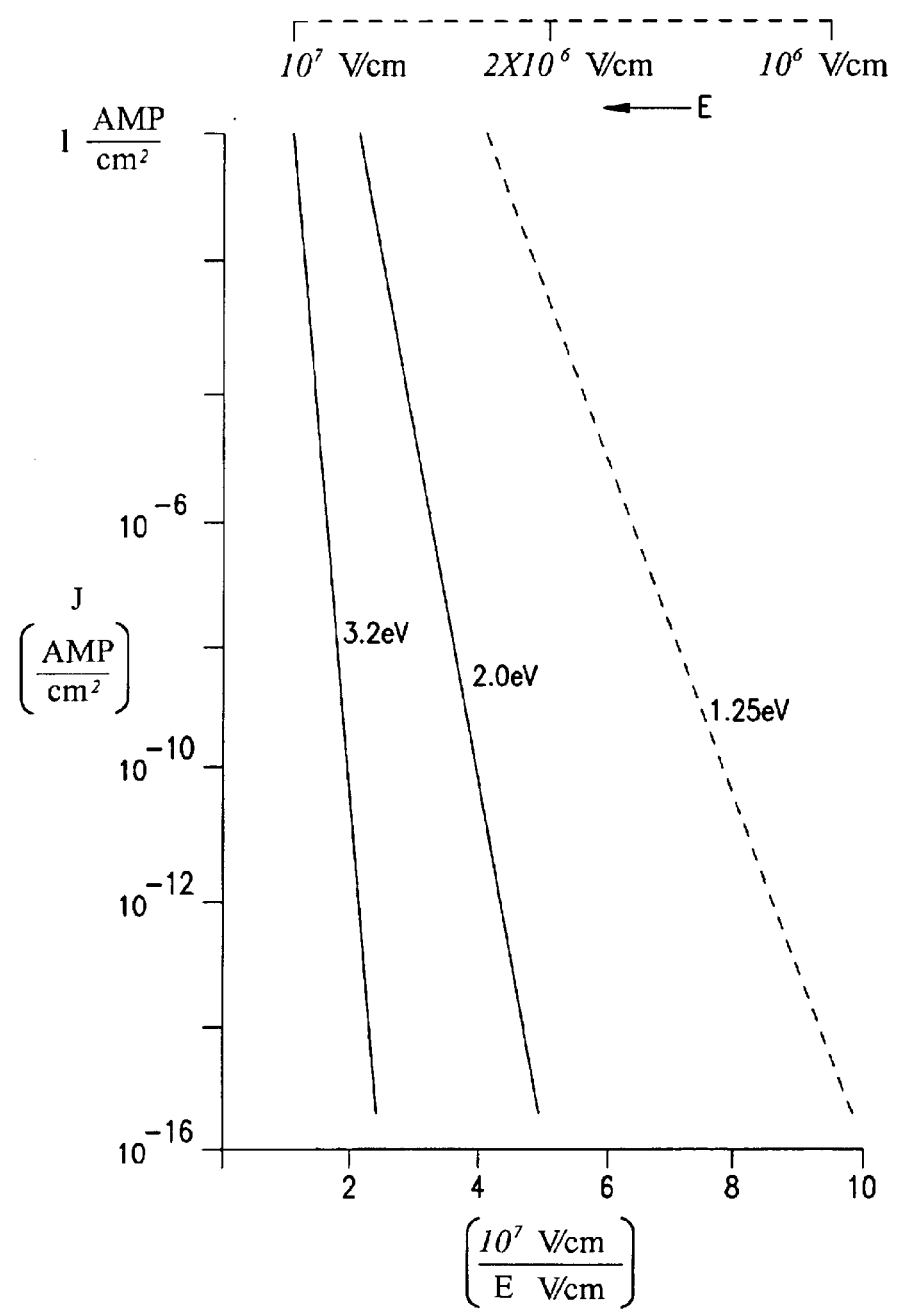
FIG. 7C is a graph plotting tunneling currents versus the applied electric fields (reciprocal applied electric field shown) for an number of barrier heights.

FIG. 7C is a graph plotting tunneling currents versus the applied electric fields (reciprocal applied electric field shown) for a number of barrier heights. FIG. 7C illustrates the dependence of the tunneling currents on electric field (reciprocal applied electric field) and barrier height. The fraction of voltage across the asymmetrical interpoly or asymmetrical intergate insulator, $\Delta V2$, can be increased by making the area of the intergate capacitor, C2, (e.g. intergate insulator 707) smaller than the area of the transistor gate capacitor, C1 (e.g. gate oxide 703). This would be required with high dielectric constant intergate dielectric insulators 707 and is easily realized with the vertical floating gate structures described above in connection with FIGS. 3, and 5A–5E.

Methods of Formation

Several examples are outlined below in order to illustrate how a diversity of such metal oxide tunnel barriers can be formed, according to the teachings of the present invention. Processing details and precise pathways taken which are not expressly set forth below will be obvious to one of ordinary skill in the art upon reading this disclosure. Firstly, although not included in the details below, it is important also to take into account the following processing factors in connection with the present invention:

(i) The poly-Si layer is to be formed with emphasis on obtaining a surface that is very smooth and morphologically stable at subsequent device processing temperatures which will exceed that used to grow Metal oxide.

(ii) The native SiO$_x$ oxide on the poly-Si surface must be removed (e.g., by sputter cleaning in an inert gas plasma in situ) just prior to depositing the metal film. The electrical characteristics of the resultant Poly-Si/Metal/Metal oxide/Metal/Poly-Si structure will be better defined and reproducible than that of a Poly-Si/Native SiO$_x$/Metal/Metal oxide/Poly-Si structure.

(iii) The oxide growth rate and limiting thickness will increase with oxidation temperature and oxygen pressure. The oxidation kinetics of a metal may, in some cases, depend on the crystallographic orientations of the very small grains of metal which comprise the metal film (see generally, O, Kubaschewski and B. E. Hopkins, "Oxidation of Metals and Alloys", Butterworth, London, pp. 53–64, 1962). If such effects are significant, the metal deposition process can be modified in order to increase its preferred orientation and subsequent oxide thickness and tunneling uniformity. To this end, use can be made of the fact that metal films strongly prefer to grow during their depositions having their lowest free energy planes parallel to the film surface. This preference varies with the crystal structure of the metal. For example, fcc metals prefer to form {111} surface plans. Metal orientation effects, if present, would be larger when only a limited fraction of the metal will be oxidized and unimportant when all or most of the metal is oxidized.

(iv) Modifications in the structure shown in FIG. 2 may be introduced in order to compensate for certain properties in some metal/oxide/metal layers. Such changes are reasonable since a wide range of metals, alloys and oxides with quite different physical and chemical properties can be used to form these tunnel junctions.

I. Formation of Asymmetrical Tunnel Barriers.

Tunnel barriers comprised of metal oxide films and having different heights at their two interfaces with the contact electrodes can be made by properly oxidizing the parent metal films. Not all oxides will exhibit asymmetrical barrier characteristics. Asymmetrical barriers can be formed on those oxides that are stable over small composition ranges so that gradients can be formed which produce different barrier heights at the top and bottom contacts. Thus SiO$_2$ and PbO films, made by conventional processes, are stable only at their stoichiometric compositions: hence, they can only serve as symmetrical barriers. However, there are many stable, crystalline metal oxides whose compositions can vary over at least small compositional ranges. The same is evidenced in the table shown in FIG. 10 which is compiled from data in a text by Kubaschewski and Hopkins. (See generally the comprehensive review by O. Kubaschewski and B. E. Hopkins, "Oxidation of Metals and Alloys," Butterworth, London (1962)). As but one example of oxide stoichiometric effects, note that thermal oxidation of aluminum below ~300 degrees Celsius produces Al$_2$O$_3$ films that become less metal-rich as the oxide thickens from ~10 to 30 or 40 Angstroms. (See generally, J. Grimblot and J. M. Eldridge, "II. Oxidation of Al Films," J. Electrochem. Soc., Vol. 129, No. 10, pp. 2369–2372, 1982). This very small compositional variation (~10$^{20}$ Al atoms/cm$^3$) leads to significant differences in barrier heights and injected currents in Al/Al$_2$O$_3$/Al structures of 0.2 eV and 10x, respectively. (See generally, K.-H. Gundlach and J. Holzl, "Logarithmic conductivity of Al—Al$_2$O$_3$—Al tunneling junctions produced by plasma- and by thermal-oxidation," Surface Science, Vol. 27, pp. 125–141, 1971; S. P. S. Arya and H. P. Singh, "Conduction properties of thin Al$_2$O$_3$ films," Thin Solid Films, Vol. 91, No. 4, pp. 363–374, May 1982). Other oxides including those containing alkaline earth and transition metal elements form variable oxide compositions and thus meet that criteria for acting as asymmetrical barriers. Most importantly and novel, it will be shown that the compositional gradients across these oxides can be uniquely controlled using certain thermodynamic characteristics of metal/oxide systems.

II. Use of Dissimilar Metal Contacts to Metal Oxide Barriers.

A second approach for forming an asymmetric barrier is to employ a control contact plate that has a different work function than that under the metal oxide dielectric layer. According to this method very asymmetric barriers can be produced by judicious selection of contact metals since their work functions can vary from low values of ~2.7 eV for rare earth metals to ~5.8 eV for platinum. (See generally, S. M. Sze, "Physics of Semiconductor Devices," 2nd Edition, Wiley-Interscience, N.Y., pp. 553–556, 1981). Note that the reported work function values can vary considerably, depending on the metal and measurement method. The same is evidenced in the table shown in FIG. 11 which is compiled from data in a text by Kubaschewski and Hopkins. (See generally the comprehensive review by O. Kubaschewski and B. E. Hopkins, "Oxidation of Metals and Alloys," Butterworth, London (1962)). Such differences can be attributed to the effects of impurity segregation, surface oxidation, grain orientation and stress. Cesiated tungsten is a well-known example of the segregation effect: very low concentrations of cesium segregates to heated tungsten surfaces, effectively changing the work function from that of W to that of Cs. A novel method will be given below for preventing such unwanted surface segregation of impurities.

Finally, both oxide composition gradients, described in connection with FIG. 10, and electrode work function effects described in connection with FIG. 11 can be utilized together to produce an even larger variety of asymmetrical tunnel junction barriers according to the teachings of the present invention.

III. Relevant Materials Properties.

Figures 8, 9:
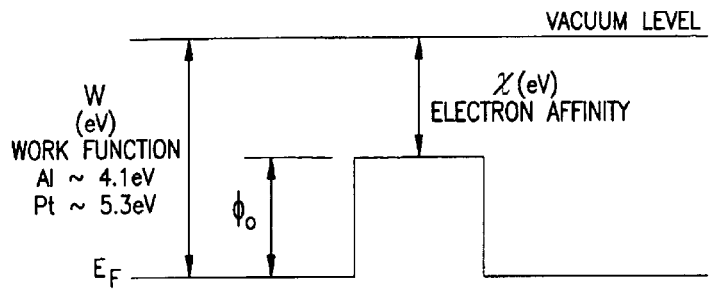
FIG. 8 illustrates a block diagram of an embodiment of an electronic system 801 according to the teachings of the present invention.
FIG. 9 is a table which provides relevant data on the barrier heights, energy gaps, dielectric constants and electron affinities of a wide variety of metal oxides that could be used as asymmetric tunnel barriers according to the teachings of the present invention.

In order to discuss the implementation of the above, it is necessary to provide more information. Thus, FIG. 8 graphically illustrates the dependence of the barrier height for current injection on the work function and electron affinity of a given, homogeneous dielectric film. FIG. 9 is a table which provides relevant data on the barrier heights, energy gaps, dielectric constants and electron affinities of a wide variety of metal oxides that could be used as asymmetric tunnel barriers according to the teachings of the present invention. (See generally, H. F. Luan et al., "High quality Ta$_2$O$_5$ gate dielectrics with T$_{ox}$ equil. 10 Angstroms," IEDM Tech. Digest, pp. 141–144, 1999; J. Robertson et al., "Schottky barrier heights of tantalum oxide, barium strontium titanate, lead titanate and strontium bismuth tantalate," App. Phys. Lett., Vol. 74, No. 8, pp. 1168–1170, February 1999; J. Robertson, "Band offsets of wide-band-gap oxides and implications for future electronic devices," J. Vac. Sci. Technol. B, Vol. 18, No. 3, pp. 1785–1791, 2000; Xin Guo et al., "High quality ultra-thin (1.5 $\mu$m) TiO$_2$/Si$_3$N$_4$ gate dielectric for deep submicron CMOS technology," IEDM Tech. Digest, pp. 137–140, 1999; H.-S. Kim et al., "Leakage current and electrical breakdown in metal-organic chemical vapor deposited TiO$_2$ dielectrics on silicon substrates," Appl. Phys. Lett., Vol. 69, No. 25, pp. 3860–3862, 1996; J. Yan et al., "Structure and electrical characterization of TiO$_2$ grown from titanium tetrakis-isoproxide (TTIP) and TTIP/H$_2$O ambient," J. Vac. Sci. Technol. B, Vol. 14, No. 3, pp. 1706–1711, 1966).

Other properties of some simple Transition Metal oxides (TM oxides) have, been shown in the table provided in FIG. 10. Note that their compositions can vary from metal-rich to their stoichiometric values. This, along with related, established oxidation data and theory (see generally, the comprehensive review by O. Kubaschewski and B. E. Hopkins, "Oxidation of Metals and Alloys," Butterworth, London (1962)) and the thermodynamic properties of solid multi-component solid systems (see, for example, R. A. Swalin, "Thermodynamics of Solids, 2nd Ed." chap. 8, pp. 165–180, John Wiley and Sons, 1972) lead to the rigorous understanding required to uniquely and controllably form asymmetrical oxide tunnel barriers as used by the present invention. Further explanation is as follows:

(i) The compositional ranges shown in the table of FIG. 10 are for thermodynamically-stable, bulk, crystalline TM oxides and should be taken as approximate values only. Ultra-thin TM oxide films may be stable over wider compositional ranges owing to surface energy and other effects.

(ii) The solid solubility of O in each TM is large, relative to most metal-oxygen systems. This phase is designated as TM(O) and forms when the TM film is exposed to oxygen. As such, this phase lies under and is in immediate contact with the growing oxide layer. Note, however, that high levels of oxygen solubility in the metals is not a pre-requisite for the present invention. FIG. 12 illustrates a hypothetical metal-oxide (M-O) phase diagram according to the teachings of the present invention.

(iii) Although the bulk equilibrium phase diagrams show that several oxides of low metallic valence exist in each of these TM-O systems, only those oxide compositions that co-exist in equilibrium with the oxidizing ambient are formed during low temperature oxidation. For example, Nb$_2$O$_5$ grows on Nb.

(iv) The ultra-thin TM oxide films grown by low temperature thermal oxidation are amorphous and do not crystallize at temperatures below ~300–400 degrees Celsius.

(v) Notwithstanding the above, a quasi-stable equilibrium exists between the growing oxide film and the underlying, partially-oxidized metal. This quasi-equilibrium can be represented schematically by a generic phase diagram for a TM(O)/TM oxide/O$_2$ system, as shown in FIG. 12. As shown in FIG. 12, the development of the co-existing phases are shown at various stages of the metal film oxidation, e.g., $C_1°$, $C_2°$, and $C_3°$, respectively. For clarity, this diagram is not drawn to scale. In accord with the Phase Rule and underlying thermodynamics, FIG. 12 shows:

(a) The composition of the TM(O) in contact with TM oxide is $C_1°$. The thickness of this saturated layer need only be a few monolayers or less but it must be present in order for oxide to grow on the underlying metal.

(b) The composition of the TM oxide in contact with TM(O) is $C_2°$.

(c) The composition of the TM oxide in contact with O$_2$ is $C_3°$.

(ix) Accordingly, the composition gradient across the TM oxide is:

$$\text{Gradient} = dC^o/dX = (C_3^o - C_2^o)/X$$

Where X is oxide thickness. In other words, thermodynamic effects in these metal-oxide systems serve to produce the desired concentration gradients across the oxide films. Thus an asymmetric tunnel barrier can be grown by low temperature thermal oxidation of a large number of metal films provided some finite thickness of metal is left unoxidized in order to fix the inner composition of the growing oxide film. The oxide composition and composition gradient therein will depend on the thermodynamic properties of metal-oxide system involved. Several key points need to be added here:

(i) The presence of effects of such a compositional gradient on the asymmetry of the tunnel barrier must be inferred via systematic studies because it is still almost, if not virtually, impossible to experimentally determine the following properties of ultra-thin oxide films (in spite of all the advanced analysis techniques now available:
  (a) Precise values (e.g., to within 0.05 to 0.1 at %) of the average composition.
  (b) Quantification of compositional gradients in oxide films.
(ii) Gradients can be estimated from the stability ranges of the bulk, crystalline oxides: this information is not likely to be known for more complex oxides.
(iii) Most metal oxides conduct current via electron transport. The barrier height for electron tunneling decreases as the oxide is made increasingly more metal-rich.
(iv) In view of the above arguments, the literature values of tunnel barriers shown in FIG. 8 can only be taken as rough guides for developing more controlled values for asymmetric tunneling applications. Such data do not take into consideration small compositional deviations from stoichiometry and their large effects on barrier heights.
(v) It is very likely indeed that the thermal oxidation approach described here represents the only way to produce ultra-thin oxide films having sufficiently-controlled compositional gradients for use in asymmetrical barrier applications. It is difficult to imagine how alternate film deposition techniques such as ALD and MOCVD can produce the thermodynamic controlling forces necessary to fine-tune oxide compositional gradients.

In addition to controlling compositional gradients across ultra-thin oxide insulating films, it is encouraging to note that oxide growth on most metals during low temperature oxidation can be very exactly controlled. This is a consequence of the fact that the thickness of an oxide grown on an initially clean surface is proportional to either log (oxidation time) or $\log^{-1}$ (time). It is experimentally difficult to differentiate the two time dependencies. Accordingly oxide growth is very rapid initially but drops to low or negligible values after forming a stable oxide thickness in the range of 20–50 Angstroms. Titanium, zirconium, vanadium, tantalum and aluminum, for example, all oxidize according to a logarithmic time dependence at temperatures below ~300 C. (See generally, the comprehensive review by O. Kubaschewski and B. E. Hopkins, "Oxidation of Metals and Alloys," Butterworth, London (1962)). Control of oxidation time is quite sufficient, other conditions being maintained, to achieve a thickness control well within an Angstrom of the target value. This point has been well-demonstrated in earlier studies involving various metals including lead. (See generally, J. M. Eldridge and J. Matisoo, "Meas. of tunnel current density in a Metal-Oxide-Metal system as a function of oxide thickness," Proc. 12th Intern. Conf. on Low Temperature Physics, pp. 427–428, 1971; J. H. Greiner, "Oxidation of lead films by rf sputter etching in an oxygen plasma," J. Appl. Phys., Vol. 45, No. 1, pp. 32–37, 1974).

FIGS. 13A–13C illustrate the compositional profiles for the asymmetrical low tunnel barrier intergate insulators according to the teachings of the present invention. FIG. 13A shows the compositional profile before oxidation. FIG. 13B shows the compositional profile during oxidation with the coexisting phases indicated. FIG. 13C shows the compositional profile at the end of oxidation.

Example I

Formation of $Al_2O_3$ Tunnel Barriers

As stated above, the conventional large barrier insulating dielectrics are silicon oxide and silicon nitride. (See generally, T. P. Ma et al., "Tunneling leakage current in ultra-thin (<4 nm) nitride/oxide stack dielectrics," IEEE Electron Device Letters, vol. 19, no. 10, pp. 388–390, 1998). The realities are that silicon oxide is not an optimum choice for memory type devices, because the 3.2 eV tunnel barrier is too high resulting in premature failure of the insulators and limiting the number of operational cycles to be in the order of $10^5$ to $10^7$.

According to one embodiment of the present invention, an asymmetrical low tunneling barrier interpoly insulator is used instead, such as $Al_2O_3$ with a tunneling barrier of approximately 2.0 eV. A number of studies have dealt with electron tunneling in $Al/Al_2O_3/Al$ structures where the oxide was grown by "low temperature oxidation" in either molecular or plasma oxygen. (See generally, S. M. Sze, Physics of Semiconductor Devices, Wiley, NY, pp. 553–556, 1981; G. Simmons and A. El-Badry, "Generalized formula for the electric tunnel effect between similar electrodes separated by a thin insulating film," J. Appl. Phys., Vol. 34, p. 1793, 1963; S. R. Pollack and C. E. Morris, "Tunneling through gaseous oxidized films of $Al_2O_3$," Trans. AIME, Vol. 233, p. 497, 1965; Z. Hurych, "Influence of nonuniform thickness of dielectric layers on capacitance and tunnel currents," Solid-State Electronics, Vol. 9, p. 967, 1966; S. P. S. Arya and H. P. Singh, "Conduction properties of thin $Al_2O_3$ films," Thin Solid Films, Vol. 91, No. 4, pp. 363–374, May 1982; K.-H. Gundlach and J. Holzl, "Logarithmic conductivity of $Al-Al_2O_3-Al$ tunneling junctions produced by plasma- and by thermal-oxidation", surface Science, Vol. 27, pp. 125–141, 1971). Before sketching out a processing sequence for these tunnel barriers, note:

(i) Capacitance and tunnel measurements indicate that the $Al_2O_3$ thickness increases with the log (oxidation time), similar to that found for PbO/Pb as well as a great many other oxide/metal systems.
(ii) Tunnel currents are asymmetrical in this system with somewhat larger currents flowing when electrons are injected from $Al/Al_2O_3$ interface developed during oxide growth. This asymmetry is due to a minor change in composition of the growing oxide: there is a small concentration of excess metal in the $Al_2O_3$, the concentration of which diminishes as the oxide is grown thicker. The excess $Al^{+3}$ ions produce a space charge that lowers the tunnel barrier at the inner interface. The oxide composition at the outer $Al_2O_3/Al$ contact is much more stoichiometric and thus has a higher tunnel barrier. In situ ellipsometer measurements on the thermal oxidation of Al films deposited and oxidized in situ support this model (see generally, J. Grimblot and J. M. Eldridge, "I. Interaction of Al films with $O_2$ at low pressures", J. Electro. Chem. Soc., Vol. 129, No. 10, pp. 2366–2368, 1982. J. Grimblot and J. M. Eldridge, "II. Oxidation of Al films", ibid, 2369–2372, 1982). In spite of this minor complication, $Al/Al_2O_3/Al$ tunnel barriers can be formed that will produce predictable and highly controllable tunnel currents that can be ejected from either electrode. The magnitude of the currents are still primarily dominated by $Al_2O_3$ thickness which can be controlled via the oxidation parametrics.

With this background, the following outlines one process path out of several that can be used to form $Al_2O_3$ tunnel barriers. Here the aluminum is thermally oxidized although one could use other techniques such as plasma oxidation (see generally, S. R. Pollack and C. E. Morris, "Tunneling through gaseous oxidized films of $Al_2O_3$," Trans. AIME, Vol. 233, p. 497, 1965; K.-H. Gundlach and J. Holzl, "Logarithmic conductivity of $Al$—$Al_2O_3$—$Al$ tunneling junctions produced by plasma- and by thermal-oxidation", Surface Science, Vol. 27, pp. 125–141, 1971) or rf sputtering in an oxygen plasma (see generally, J. H. Greiner, "Oxidation of lead films by rf sputter etching in an oxygen plasma", J. Appl. Phys., Vol. 45, No. 1, pp. 32–37, 1974). For the sake of brevity, some details noted above will not be repeated.

(i) Sputter deposit aluminum on poly-Si at a temperature of ~25 to 150 degrees Celsius. Due to thermodynamic forces, the micro-crystallites of the f.c.c. aluminum will have a strong and desirable (111) preferred orientation.

(ii) Oxidize the aluminum in situ in molecular oxygen using temperatures, pressure and time to obtain the desired $Al_2O_3$ thickness. The thickness increases with log (time) and can be controlled via time at a fixed oxygen pressure and temperature to within 0.10 Angstroms, when averaged over a large number of aluminum grains that are present under the counter-electrode. One can readily change the $Al_2O_3$ thickness from ~15 to 35 A by using appropriate oxidation parametrics (e.g., see FIG. 3, J. Grimblot and J. M. Eldridge, "I. Interaction of Al films with $O_2$ at low pressures", J. Electro. Chem. Soc., Vol. 129, No. 10, pp. 2366–2368, 1982). The oxide will be amorphous and remain so until temperatures in excess of 400 degrees Celsius are reached. The initiation of recrystallization and grain growth can be suppressed, if desired, via the addition of small amounts of glass forming elements (e.g., Si) without altering the growth kinetics or barrier heights significantly.

(iii) Re-evacuate the system and deposit a second metal layer of aluminum or other contact metal having a work function different from that of aluminum.

(iv) Deposit the Poly-Si control gate layer using conventional processes.

As mentioned above, this oxide insulator is used as an asymmetrical low tunnel barriers, of the order of 2.0 eV, as the inter-poly or inter-gate dielectric insulators. The characteristics of such oxide insulators have been summarized in FIG. 9. According to the teachings of the present invention, asymmetrical low barriers are utilized in programmable array logic or memory device which are easy to write and/or erase. To achieve the correct barrier height different contact metals as for instance aluminum (Al) and platinum (Pt) may be used as illustrated in FIGS. 2 and 3. As stated previously, very asymmetrical barriers can be produced by the judicious selecting of contact metals since their work functions can vary from low values of ~2.7 eV for rare earth metals to ~5.8 eV for platinum. That is according to the teachings of the present invention the floating gate includes a polysilicon floating gate having a metal layer formed thereon in contact with the asymmetrical low tunnel barrier intergate insulator. Additionally, as described above, the control gate includes a polysilicon control gate with a metal layer, having a work function different from that of the metal layer formed on the floating gate, formed thereon in contact with the asymmetrical low tunnel barrier intergate insulator. In conjunction with the invention, the asymmetrical low tunnel barrier interpoly insulator is formed such that the tunnel barrier is approximately 2.0 eV.

Example II

Formation of Single- and Multi-Layer Transition Metal Oxide Tunnel Barriers

The band gap energies and barrier heights of some conventional gate insulators as silicon oxide, silicon nitride and aluminum oxide as well as tantalum oxide have been investigated and described in detail (see generally, H. Itokawa et al., "Determination of bandgap and energy band alignment for high-dielectric-constant gate insulators using high-resolution x-ray photoelectron spectroscopy," Ext. Abstracts Int. Conf. On Solid State Devices and Materials, pp. 158–159, 1999). Formation of single and double-layer dielectric layers of oxides of $Ta_2O_5$ and similar transition metal oxides can be accomplished by thermal as well as plasma oxidation of films of these metals. (See generally, H. F. Luan, et al., "High quality $Ta_2O_5$ gate dielectrics with $T_{ox\ eq}$<10 Å," International Electron Devices Meeting Technical digest, p. 141–144, 1999; J. Robertson and C. W. Chen, "Schottky barrier heights of tantalum oxide, barium strontium titanate, lead titanate, and strontium bismuth tantalate," Appl. Phys. Lett., vol. 74, no. 8, pp. 1168–1170, 22 February 1999).

For $TiO_2$ (see generally, John Robertson, "Band offsets of wide-band-gap oxides and implications for future electronic devices," J. Vac. Sci. Technol., vol. B 18, no. 3, 1785–94, May–June, 2000; Xin Guo, et al., "High quality ultra-thin (1.5 nm) $TiO_2/Si_3N_4$ gate dielectric for deep submicron CMOS technology", International Electron Devices Meeting Technical Digest, p. 137–140, 1999; Hyeon-Seag Kim, et al., "Leakage current and electrical breakdown in metal-organic chemical vapor deposited $TiO_2$ dielectrics on silicon substrates," vol. 69, no. 25, pp. 3860–62, 16 December, 1996; J. Yan, et al., "Structure and electrical characterization of $TiO_2$ grown from titanium tetrakis-isoproxide (TTIP) and TTIP/$H_2O$ ambient," J. Vac. Sci. Technol., vol. B14, no. 3, 1706–11, 1996), $Zro_2$ (Wen-Jie Qi, et al., "MOSCAP and MOSFET characteristics using $ZrO_2$ gate dielectric deposited directly on Si," Technical Digest of 1999 IEDM, P. 145–148; Y. Ma, et al., "Zirconium Oxide Band Gate Dielectrics with Equivalent Oxide and Thickness of Less Than 1.0 nm and Performance of Sub-micron MOSFET using a Nitride Gate Replacement Process," Digest of 1999 IEDM, p. 149–152.

See also, Afanas' ev et al., "Electron energy barriers between (100) Si and ultrathin stacks of $SiO_2$, $Al_2O_3$, and $ZrO_2$ insulators," Appl. Phys. Lett., vol. 78, no. 20, pp. 3073–75, 2001), $Nb_2O_5$ (K. Kukli et al., development of dielectric properties of niobium oxide, tantalum oxide, and aluminum oxide based nanolayered materials," J. Electrochem. Soc., vol. 148, no. 2, pp. F35–F41, 2001), $Gd_2O_3$ and $Y_2O_3$ (J. Kwo, et al., "Properties of high k gate dielectrics $Gd_2O_3$ and $Y_2O_3$ for Si," J. Appl. Phys., vol. 89, no. 7, pp. 3920–27, 2001).

According to the teachings of the present invention, several of the above implementations have been described in considerable detail in a co-pending, co-filed application Ser. No. 09/945,507 by L. Forbes and J. M. Eldridge, entitled "FLASH MEMORY DEVICES WITH METAL OXIDE INTERPLOY INSULATORS,". In some cases the characteristics of the resulting dielectric insulators are not yet well known or well defined. Part of this detail is recounted as follows.

For example, single layers of $Ta_2O_5$, $TiO_2$, $ZrO_2$, $Nb_2O_5$ and similar transition metal oxides can be formed by "low temperature oxidation" of numerous Transition Metal (e.g., TM oxides) films in molecular and plasma oxygen and also by rf sputtering in an oxygen plasma. The thermal oxidation kinetics of these metals have been studied for decades with numerous descriptions and references to be found in the book by Kubaschewski and Hopkins (see generally, O. Kubaschewski and B. E. Hopkins, "Oxidation of Metals and Alloys", Butterworth, London, pp. 53–64, 1962). In essence, such metals oxidize via logarithmic kinetics to reach thicknesses of a few to several tens of angstroms in the range of 100 to 300 degrees Celsius. Excellent oxide barriers for Josephson tunnel devices can be formed by rf sputter etching these metals in an oxygen plasma (see generally, J. M. Greiner, "Josephson tunneling barriers by rf sputter etching in an oxygen plasma," J. Appl. Phys., Vol. 42, No. 12, pp. 5151–5155, 1971; O. Michikami et al., "Method of fabrication of Josephson tunnel junctions," U.S. Pat. No. 4,412,902, Nov. 1, 1983). Such "low temperature oxidation" approaches differ considerably from MOCVD processes used to produce these TM oxides. MOCVD films require high temperature oxidation treatments to remove carbon impurities, improve oxide stoichiometry and produce recrystallization. Such high temperature treatments also cause unwanted interactions between the oxide and the underlying silicon and thus have necessitated the introduction of interfacial barrier layers. (See, for example, H. F. Luan et al., "High quality $Ta_2O_5$ gate dielectrics with $T_{ox,eq}<10$ angstroms," IEDM Tech. Digest, pp. 141–144, 1999).

A new approach was described in a copending application by J. M. Eldridge, entitled "Thin Dielectric Films for DRAM Storage Capacitors," patent application Ser. No. 09/651,380 filed Aug. 29, 2000 that utilizes "low temperature oxidation" to form duplex layers of TM oxides. Unlike MOCVD films, the oxides are very pure and stoichiometric as formed. They do require at least a brief high temperature (est. 700 to 800 degrees Celsius but may be lower) treatment to transform their microstructures from amorphous to crystalline and thus increase their dielectric constants to the desired values (>20 or so). Unlike MOCVD oxides, this treatment can be carried out in an inert gas atmosphere, thus lessening the possibility of inadvertently oxidizing the poly-Si floating gate. While this earlier disclosure was directed at developing methods and procedures for producing high dielectric constant films for storage cells for DRAMs, the same teachings can be applied to producing thinner asymmetrical metal oxide tunnel films for the programmable array logic and memory devices described in this disclosure. The dielectric constants of these TM oxides are substantially greater (>25 to 30 or more) than those of PbO and $Al_2O_3$. Duplex layers of these high dielectric constant oxide films are easily fabricated with simple tools and also provide improvement in device yields and reliability. Each oxide layer will contain some level of defects but the probability that such defects will overlap is exceedingly small. Effects of such duplex layers were first reported by J. M. Eldridge, one of the present authors, and are well known to practitioners of the art. It is worth mentioning that highly reproducible TM oxide tunnel barriers can be grown by rf sputtering in an oxygen ambient, as referenced above (see generally, J. M. Greiner, "Josephson tunneling barriers by rf sputter etching in an oxygen plasma," J. Appl. Phys., Vol. 42, No. 12, pp. 5151–5155, 1971; O. Michikami et al., "Method of fabrication of Josephson tunnel junctions," U.S. Pat. No. 4,412,902, Nov. 1, 1983). Control over oxide thickness and other properties in these studies were all the more remarkable in view of the fact that the oxides were typically grown on thick (e.g., 5,000 Å) metals such as Nb and Ta. In such metal-oxide systems, a range of layers and suboxides can also form, each having their own properties. In the present disclosure, control over the properties of the various TM oxides will be even better since very limited (perhaps 10 to 100 Å or so) thicknesses of metal are employed and thereby preclude the formation of significant quantities of unwanted, less controllable sub-oxide films. Thermodynamic forces will drive the oxide compositions to their most stable, fully oxidized state, e.g., $Nb_2O_5$, $Ta_2O_5$, etc. As noted above, it will still be necessary to crystallize these duplex oxide layers. Such treatments can be done by RTP and will be shorter than those used on MOCVD and sputter-deposited oxides since the stoichiometry and purity of the "low temperature oxides" need not be adjusted at high temperature.

Fairly detailed descriptions for producing thicker duplex layers of TM oxides have been given in the copending application by J. M. Eldridge, entitled "Thin Dielectric Films for DRAM Storage Capacitors," patent application Ser. No. 09/651,380 filed Aug. 29, 2000, which is incorporated by reference. Although perhaps obvious to those skilled in the art, one can sketch out a few useful fabrication guides:

(i) Thinner TM layers will be used in this invention relative to those used to form DRAMs. Unlike DRAMs where leakage must be eliminated, the duplex oxides used here must be thin enough to carry very controlled levels of current flow when subjected to reasonable applied fields and times.

(ii) The TM and their oxides are highly refractory and etchable (e.g., by RIE). Hence they are quite compatible with poly-Si control gate processes and other subsequent steps.

(iii) TM silicide formation will not occur during the oxidation step. It could take place at a significant rate at the temperatures used to deposit the poly-Si control gate. If so, several solutions can be applied including:
  (i) Insert certain metals at the TM/poly-Si boundaries that will prevent inter-diffusion of the TM and the poly-Si.
  (ii) Completely oxide the TMs. The electrical characteristics of the resulting poly-Si/TM oxide 1/TM oxide 2/poly-Si structure will be different in the absence of having TM at the oxide/metal interfaces.

Insulator and contact metal layer combinations, e.g. platinum (Pt) and aluminum (Al), or other contact metals with different work functions with appropriate barrier heights, according to the teachings of the present invention, have been shown in FIG. 9. Also, as described above, the asymmetrical transition metal oxide interpoly insulators can be formed having a tunnel barrier of approximately 2.0 eV as required by the present invention.

Example III

Formation of Alternate Metal Compound Tunnel Barriers

Although no applications may be immediately obvious, it is conceivable that one might want to form a stack of asymmetrical oxide films having quite different properties, for example, a stack comprised of a high dielectric constant (k) oxide/a low k oxide/a high k oxide. "Low temperature oxidation" can be used to form numerous variations of such structures. While most of this disclosure deals with the formation and use of stacks of asymmetrical oxide dielectrics, it is also possible to use "low temperature oxidation" to form other thin film dielectrics such as nitrides, oxynitrides, etc. that could provide additional functions such as being altered by monochromatic light, etc. These will not be discussed further here.

Example IV

Formation of Perovskite Oxide Tunnel Barriers

Asymmetrical oxide tunnel barriers having a wide range of properties can also be grown via oxidation of alloy films of appropriate compositions (see generally, J. Robertson and C. W. Chen, "Schottky barrier heights of tantalum oxide, barium strontium titanate, lead titanate, and strontium bismuth tantalate," Appl. Phys. Lett., vol. 74, no. 8, pp. 1168–1170, 22 February 1999) and as referenced in the copending, co-filed application Ser. No. 09/945,507 by L. Forbes and J. M. Eldridge, entitled "FLASH MEMORY DEVICES WITH METAL OXIDE INTERPLOY INSULATORS,". Thin film barriers of platinum, palladium and similar noble metals must be added to prevent interdiffusion and degradation of the perovskite oxides with the poly-Si layers. Some processing remarks are stated below.

For example, results have been obtained which demonstrate that at least a limited range of high temperature, super-conducting oxide films can be made by thermally oxidizing Y-Ba-Cu alloy films (see generally, Hase et al., "Method of manufacturing an oxide superconducting film," U.S. Pat. No. 5,350,738, Sep. 27, 1994). The present inventors have also disclosed how to employ "low temperature oxidation" and short thermal treatments in an inert ambient at 700 degrees Celsius in order to form a range of perovskite oxide films from parent alloy films (see generally, J. M. Eldridge, "Low Cost Processes for Producing High Quality Perovskite Dielectric Films," application Ser. No. 09/945, 189. The dielectric constants of crystallized, perovskite oxides can be very large, with values in the 100 to 1000 or more range. The basic process is more complicated than that needed to oxidize layered films of transition metals. (See Example II.) The TM layers would typically be pure metals although they could be alloyed. The TMs are similar metallurgically as are their oxides. In contrast, the parent alloy films that can be converted to a perovskite oxide are typically comprised of metals having widely different chemical reactivities with oxygen and other common gasses. In the Y—Ba—Cu system referenced above, Y and Ba are among the most reactive of metals while the reactivity of Cu approaches (albeit distantly) those of other noble metals. If the alloy is to be completely oxidized, then thin film barriers such as Pd, Pt, etc. or their conductive oxides must be added between the Si and the parent metal film to serve as: electrical contact layers; diffusion barriers; and, oxidation stops. In such a case, the Schottky barrier heights of various TM oxides and perovskite oxides in contact with various metals will help in the design of the tunnel device. In the more likely event that the perovskite parent alloy film will be only partially converted to oxide and then covered with a second layer of the parent alloy (recall the structure of FIG. 2), then the barrier heights will represent that developed during oxide growth at the parent perovskite alloy/perovskite oxide interface. Obviously, such barrier heights cannot be predicted ab initio for such a wide class of materials but will have to be developed as the need arises. This information will have to be developed on a system-by-system basis.

Example V

Formation of Asymmetric Tunnel Barriers with Dissimilar Metals

In order to implement this, it is necessary to proceed as above but then deposit a different contact layer than that used to form the thermally-grown oxide barrier layer. The choice of the top metal will be determined by the desired offset voltages that are to be applied to write and erase the device. Great caution must be applied to prevent unwanted impurity segregation during the deposition of the top electrode material or during subsequent device processing treatments. In many cases, this can be accomplished by depositing the top electrode metal from an Ultra-Pure source. This may not be sufficient for producing top electrode metals having sufficiently controlled work functions. In such cases, the problem can be solved by depositing the metal under a low partial pressure of oxygen. The oxygen is to be introduced after the first several monolayers of metals have been deposited. In this way, the top electrode metal can be formed with a very modest level of internal oxidation that will substantially block impurities from diffusing to the inner interface and thus alter the desired work function. Levels of oxygen up to a few percent generally have no perceptible effect on metal conductivity at ambient temperatures and above.

Doping of metals with oxygen is a relatively easily controlled process and works along the following lines:

(i) At a pressure of 1 micron of oxygen, a monolayer of oxygen will be absorbed in 1 second if its sticking coefficient is unity.

(ii) As well-known in surface science, the sticking coefficient of oxygen on most metals is closer to 0.01 so that 100 seconds of exposure are needed to form a monolayer of oxygen on a clean metal surface. Accordingly this will have to be taken into account in order to empirically determine the amount of oxygen that may be required to block impurity segregation to the metal surface.

Method of Operation

Write can be achieved by tunneling from the control gate to the floating gate by driving the control gate negative and/or channel hot electron injection as in conventional flash memory devices. Erase would be accomplished by driving the control gates with a relatively large positive voltage and tunneling from the metal on top of the floating gate to the metal on the bottom of the control gate through the asymmetrical low tunnel barrier intergate insulators of the present invention. An asymmetrical low tunnel barrier between the floating gate and the control gate will make the erase operation easy.

In n-channel enhancement mode devices are used in the array, reading is accomplished by driving the control gate with a smaller positive voltage. If no electrons are stored on the floating gate the transistor will turn on. If electrons are stored on the floating gate the transistor will not turn on or only turn on at a lower conductivity state. This constitutes the memory function. If n-channel depletion mode devices are used in the array then reading of the stored data is accomplished with a zero or negative gate voltage, if the device conducts with zero or negative small gate voltage then there is no charge stored on the floating gate. If the floating gate is charged by stored electrons then the transistor will not conduct with zero or low negative gate voltages. The presence of stored charge on the floating gate and/or applied negative gate voltages will result in electric fields in the interpoly/intergate insulator. If the gate oxide is 2 nm (20 Å) thick then the capacitance is about $1.6 \times 10^{-6}$ F/cm$^2$ and a 1 Volt difference will store a charge of $1.6 \times 10^{-6}$ Coulombs/cm$^2$. A retention time of one second requires a leakage current of less than about $10^{-6}$ Amps/cm$^2$, if as shown in FIG. 7C the tunneling barrier is 2.0 eV and the electric field in the interpoly/intergate insulator is less than about $2 \times 10^6$ V/cm then the current density will be $10^{-16}$ Amps/cm$^2$ and the retention time $10^{+10}$ seconds. One year is about $3 \times 10^{+7}$ seconds, very long retention times can be achieved by using low electric fields during read in conjunction with the larger tunnel barrier during read.

During erase a positive voltage is applied to the control gate to tunnel electrons off of the floating gate. If in this case during erase the electric field in the interpoly/intergate insulator is about $2 \times 10^6$ V/cm and the erase barrier is as low as 1.25 eV then the erase current will be about 1 milliamp Amp/cm$^2$ and erase will be about 1 millisecond. This simple illustration serves to show that an asymmetrical tunneling barrier can make many orders of magnitude differences in the time for the same charge to change by tunneling even at the same electric fields. The electric field during erase can be increased if a faster erase time is required and erase easily achieved in less than a microsecond. The lower tunneling barrier results in a much faster erase at much lower electric fields and than in conventional flash memory devices which require fields of $10^7$ V/cm to achieve the erase currents of 1 Amp/cm$^2$ with a silicon oxide tunnel barrier of 3.2 eV. Thus, the asymmetrical tunnel barriers of the present invention can serve to make erase of flash memory type devices easy while insuring a long retention time during standby and read operations.

System Level

Figure 14:
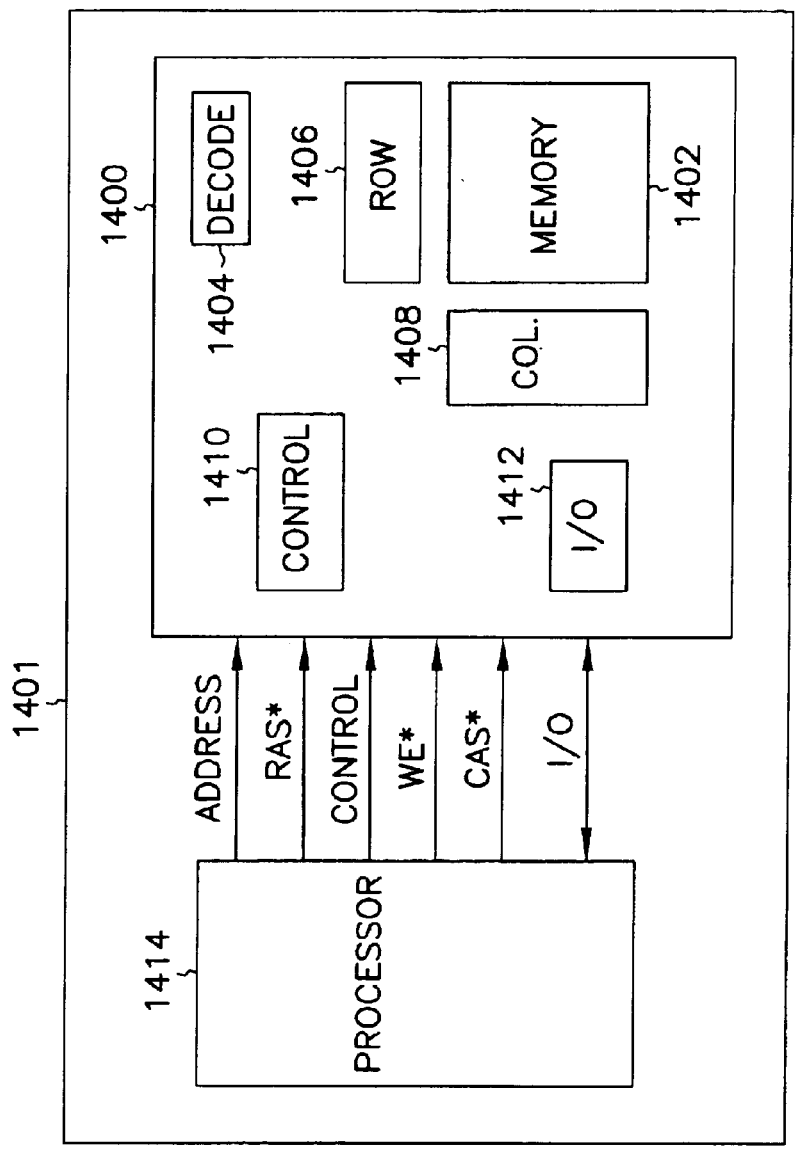
FIG. 14 illustrates a block diagram of an embodiment of an electronic system according to the teachings of the present invention.

FIG. 14 illustrates a block diagram of an embodiment of an electronic system 1401 according to the teachings of the present invention. In the embodiment shown in FIG. 14, the system 1401 includes a memory device 1400 which has an array of memory cells 1402, address decoder 1404, row access circuitry 1406, column access circuitry 1408, control circuitry 1410, and input/output circuit 1412. Also, as shown in FIG. 14, the circuit 1401 includes a processor 1414, or memory controller for memory accessing. The memory device 1400 receives control signals from the processor 1414, such as WE*, RAS* and CAS* signals over wiring or metallization lines. The memory device 1400 is used to store data which is accessed via I/O lines. It will be appreciated by those skilled in the art that additional circuitry and control signals can be provided, and that the memory device 1400 has been simplified to help focus on the invention. At least one of the processor 1414 or memory device 1400 has a memory cell formed according to the embodiments of the present invention. That is, at least one of the processor 1414 or memory device 1400 includes an asymmetrical low tunnel barrier interpoly insulator according to the teachings of the present invention.

It will be understood that the embodiment shown in FIG. 14 illustrates an embodiment for electronic system circuitry in which the novel memory cells of the present invention are used. The illustration of system 1401, as shown in FIG. 14, is intended to provide a general understanding of one application for the structure and circuitry of the present invention, and is not intended to serve as a complete description of all the elements and features of an electronic system using the novel memory cell structures. Further, the invention is equally applicable to any size and type of memory device 1400 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSIONS

Asymmetrical low barrier tunnel insulators are described between the floating gate and control gate in a flash memory type devices to form programmable array logic and memory devices. The asymmetrical low barrier insulators, ~2.0 eV, are easily fabricated by the oxidation of a transition metal or a composite metal layer. While the amount of charge stored on the floating gate is small the transistor provides gain and charge multiplication resulting in a large output signal and ease of reading the stored data. If there is an adverse capacitance ratio due to a large difference of dielectric constants then the vertical gate structures described previously can be employed.

Write can be achieved by the normal channel hot electron injection and gate current through the silicon oxide to the floating gate. This is done by selecting a particular column by applying a high control gate voltage and applying relatively large drain voltage as is done with conventional ETOX memory devices. However, according to the teachings of the present invention, write can also be accomplished by applying a positive voltage to the substrate or well select line and a large negative voltage to the control gates, electrons will tunnel from the control gate to the floating gate. The asymmetrical low tunnel barrier will provide an easy write operation and the selection of the substrate or well bias will provide selectivity and address only one device.

According to the teachings of the present invention, erase is achieved by providing a negative voltage to the substrate or well address line and a large positive voltage to the control gate. This causes electrons to tunnel off of the floating gate on to the control gate. A whole row can be erased by addressing all the column lines along that row and a block can be erased by addressing multiple row back gate or substrate/well address lines.

It has been shown that the asymmetrical low tunnel barrier interpoly insulators of the present invention avoid the large barriers to electron tunneling or hot electron injection presented by the silicon oxide-silicon interface, 3.2 eV, which result in slow write and erase speeds even at very high electric fields. The present invention also avoids the combination of very high electric fields and damage by hot electron collisions in the which oxide result in a number of operational problems like soft erase error, reliability problems of premature oxide breakdown and a limited number of cycles of write and erase. Further, the asymmetrical low tunnel barrier interplay dielectric insulator erase approach, of the present invention remedies the above mentioned problems of having a rough top surface on the polysilicon floating gate which results in, poor quality interpoly oxides, sharp points, localized high electric fields, premature breakdown and reliability problems.

What is claimed is:

1. A flash memory array, comprising:
    a number of depletion mode, non-volatile memory cells, wherein each non-volatile memory cell includes:
        a first source/drain region and a second source/drain region separated by a channel region;
        a floating gate opposing the channel region and separated therefrom by a gate oxide;
        a control gate opposing the floating gate; and
        wherein the control gate is separated from the floating gate by an asymmetrical low tunnel barrier intergate insulator having a number of small compositional ranges such that gradients can be formed which produce different barrier heights at an interface with the floating gate and control gate;
    a number of sourcelines coupled to the first source/drain regions along a first selected direction in the flash memory array;
    a number of control gate lines coupled to the control gates along a second selected direction in the flash memory array; and
    a number of bitlines coupled to the second source/drain regions along a third selected direction in the flash memory array.

2. The flash memory array of claim 1, wherein the asymmetrical low tunnel barrier intergate insulator includes a metal oxide insulator selected from the group consisting of $Al_2O_3$, $Ta_2O_5$, $TiO_2$, $ZrO_2$, $Nb_2O_5$, $SrBi_2Ta_2O_3$, $SrTiO_3$, $PbTiO_3$, and $PbZrO_3$.

3. The flash memory array of claim 1, wherein the floating gate includes a polysilicon floating gate having a metal layer formed thereon in contact with the asymmetrical low tunnel barrier intergate insulator.

4. The flash memory array of claim 3, wherein the control gate includes a polysilicon control gate having a metal layer formed thereon in contact with the asymmetrical low tunnel barrier intergate insulator, wherein the metal layer formed on the polysilicon control gate includes a metal layer that has a different work function than the metal layer formed on the floating gate.

5. The flash memory array of claim 4, wherein the metal layer formed on the floating gate includes a parent metal for the asymmetrical low tunnel barrier intergate insulator and the metal layer formed on the control gate includes a metal layer having a work function in the range of 2.7 eV to 5.8 eV.

6. The flash memory array of claim 1, wherein the second selected direction and the third selected direction are parallel to one another and orthogonal to the first selected direction, and wherein the number of control gate lines serve as address lines.

7. The flash memory array of claim 1, wherein the first selected direction and the third selected direction are parallel to one another and orthogonal to the second selected direction, and wherein the number of control gate lines serve as address lines.

8. The flash memory array of claim 1, wherein the first selected direction and the second selected direction are parallel to one another and orthogonal to the third selected direction, and wherein the number of bitlines serve as address lines.

9. An array of flash memory cells, comprising:
    a number of pillars extending outwardly from a substrate, wherein each pillar includes a first source/drain region, a body region, and a second source/drain region;
    a number of floating gates opposing the body regions in the number of pillars and separated therefrom by a gate oxide;
    a number of control gates opposing the floating gates;
    a number of buried sourcelines disposed below the number of pillars and coupled to the first source/drain regions along a first selected direction in the array of memory cells;
    a number of control gate lines formed integrally with the number of control gates along a second selected direction in the array of flash memory cells, wherein the number of control gates are separated from the floating gates by a low tunnel barrier intergate insulator having a number of small compositional ranges such that gradients can be formed by an applied electric field which produce different barrier heights at an interface with the floating gate and control gate; and
    a number of bitlines coupled to the second source/drain regions along a third selected direction in the array of flash cells.

10. The array of flash memory cells of claim 9, wherein the low tunnel barrier intergate insulator includes a metal oxide insulator selected from the group consisting of $Al_2O_3$, $Ta_2O_5$, $TiO_2$, $Zro_2$, $Nb_2O_5$, $SrBi_2Ta_2O_3$, $SrTiO_3$, $PbTiO_3$, and $PbZrO_3$.

11. The array of flash memory cells of claim 9, wherein each floating gate includes a polysilicon floating gate having a metal layer formed thereon in contact with the asymmetrical low tunnel barrier intergate insulator.

12. The array of flash memory cells of claim 11, wherein each control gate includes a polysilicon control gate having a metal layer formed thereon in contact with the low tunnel barrier intergate insulator, wherein the metal layer formed on the polysilicon control gate includes a metal layer that has a different work function than the metal layer formed on the floating gate.

13. The flash memory array of claim 12, wherein the metal layer formed on the floating gate includes a parent metal for the asymmetrical low tunnel barrier intergate insulator and the metal layer formed on the control gate includes a metal layer having a work function in the range of 2.7 eV to 5.8 eV.

14. The array of flash memory cells of claim 9, wherein each floating gate is a vertical floating gate formed in a trench below a top surface of each pillar such that each trench houses a pair of floating gates opposing the body regions in adjacent pillars on opposing sides of the trench.

15. The array of flash memory cells of claim 9, wherein the plurality of control gate lines are formed in the trench below the top surface of the pillar and between the pair of floating gates, wherein each pair of floating gates shares a single control gate line, and wherein each floating gate includes a vertically oriented floating gate having a vertical length of less than 100 nanometers.

16. The array of flash memory cells of claim 15, wherein the plurality of control gate lines are disposed vertically above the floating gates.

17. The array of flash memory cells of claim 9, wherein the plurality of control gate lines are formed in the trench below the top surface of the pillar and between the pair of floating gates such that each trench houses a pair of control gate lines each addressing the floating gates one on opposing sides of the trench respectively, and wherein the pair of control gate lines are separated by an insulator layer.

18. The array of flash memory cells of claim 9, wherein the plurality of control gate lines are disposed vertically above the floating gates, and wherein each pair of floating gates shares a single control gate line.

19. The array of flash memory cells of claim 9, wherein the plurality of control gate lines are disposed vertically above the floating gates, and wherein each one of the pair of floating gates is addressed by an independent one of the plurality of control gate lines.

20. The array of flash memory cells of claim 9, wherein each floating gate is a horizontally oriented floating gate formed in a trench below a top surface of each pillar such that each trench houses a floating gate opposing the body regions in adjacent pillars on opposing sides of the trench, and wherein each horizontally oriented floating gate has a vertical length of less than 100 nanometers opposing the body region of the pillars.

21. A programmable logic array, comprising:
a plurality of input lines for receiving an input signal;
a plurality of output lines; and
one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to a received input signal, wherein each logic cell includes a vertical non-volatile memory cell including:
a first source/drain region formed on a substrate;
a body region including a channel region formed on the first source/drain region;
a second source/drain region formed on the body region;
a floating gate opposing the channel region and separated therefrom by a gate oxide;
a control gate opposing the floating gate; and
wherein the control gate is separated from the floating gate by a low tunnel barrier intergate insulator having a number of small compositional ranges such that gradients can be formed by an applied electric field which produce different barrier heights at an interface with the floating gate and control gate.

22. An electronic system, comprising:
a processor; and
a memory device coupled to the processor, wherein at least one of the memory device and processor includes an array of depletion mode flash memory cells, comprising:
a number of pillars extending outwardly from a substrate, wherein each pillar includes a first source/drain region, a body region, and a second source/drain region;
a number of floating gates opposing the body regions in the number of pillars and separated therefrom by a gate oxide;
a number of control gates opposing the floating gates;
a number of buried sourcelines disposed below the number of pillars and coupled to the first source/drain regions along a first selected direction in the array of memory cells;
a number of control gate lines formed integrally with the number of control gates along a second selected direction in the array of flash memory cells, wherein the number of control gates are separated from the floating gates by a low tunnel barrier intergate insulator having a number of small compositional ranges such that gradients can be formed by an applied electric field which produce different barrier heights at an interface with the floating gate and control gate; and
a number of bitlines coupled to the second source/drain regions along a third selected direction in the array of flash memory cells.

23. The electronic system of claim 22, wherein the asymmetrical low tunnel barrier intergate insulator includes a metal oxide insulator selected from the group consisting of $Al_2O_3$, $Ta_2O_5$, $TiO_2$, $ZrO_2$, $Nb_2O_5$, $SrBi_2Ta_2O_3$, $SrTiO_3$, $PbTiO_3$, and $PbZrO_3$.

24. The electronic system of claim 22, wherein each floating gate includes a polysilicon floating gate having a metal layer formed thereon in contact with the low tunnel barrier intergate insulator.

25. The electronic system of claim 22, wherein each control gate includes a polysilicon control gate having a metal layer formed thereon in contact with the low tunnel barrier intergate insulator, wherein the metal layer formed on the polysilicon control gate includes a metal layer that has a different work function than the metal layer formed on the floating gate.

26. The flash memory array of claim 25, wherein the metal layer formed on the floating gate includes a parent metal for the asymmetrical low tunnel barrier intergate insulator and the metal layer formed on the control gate includes a metal layer having a work function in the range of 2.7 eV to 5.8 eV.

27. The electronic system of claim 22, wherein each floating gate is a vertical floating gate formed in a trench below a top surface of each pillar such that each trench houses a pair of floating gates opposing the body regions in adjacent pillars on opposing sides of the trench.

28. The electronic system of claim 22, wherein the plurality of control gate lines are formed in the trench below the top surface of the pillar and between the pair of floating gates, wherein each pair of floating gates shares a single control gate line, and wherein each floating gate includes a vertically oriented floating gate having a vertical length of less than 100 nanometers.

29. The electronic system of claim 22, wherein the plurality of control gate lines are formed in the trench below the top surface of the pillar and between the pair of floating gates such that each trench houses a pair of control gate lines each addressing the floating gates one on opposing sides of the trench respectively, and wherein the pair of control gate lines are separated by an insulator layer.

30. The electronic system of claim 22, wherein the plurality of control gate lines are disposed vertically above the floating gates, and wherein each pair of floating gates shares a single control gate line.

31. The electronic system of claim 22, wherein the plurality of control gate lines are disposed vertically above the floating gates, and wherein each one of the pair of floating gates is addressed by an independent one of the plurality of control lines.

32. The electronic system of claim 22, wherein each floating gate is a horizontally oriented floating gate formed in a trench below a top surface of each pillar such that each trench houses a floating gate opposing the body regions in adjacent pillars on opposing sides of the trench, and wherein each horizontally oriented floating gate has a vertical length of less than 100 nanometers opposing the body region of the pillars.

33. The electronic system of claim 22, wherein the plurality of control gate lines are disposed vertically above the floating gates.

34. A method of forming a floating gate transistor, comprising:
    forming a first source/drain region and a second source/drain region separated by a channel region in a substrate;
    forming a floating gate opposing the channel region and separated therefrom by a gate oxide;
    forming a control gate opposing the floating gate; and
    forming an asymmetrical low tunnel barrier intergate insulator to separate the control gate from the floating gate, wherein forming the low tunnel barrier intergate insulator includes a forming low tunnel barrier intergate insulator having a number of small compositional ranges such that gradients can be formed by an applied electric field which produce different barrier heights at an interface with the floating gate and control gate.

35. The method of claim 34, wherein forming the asymmetrical low tunnel barrier intergate insulator includes forming a metal oxide insulator selected from the group consisting of $Al_2O_3$, $Ta_2O_5$, $TiO_2$, $Zro_2$, $Nb_2O_5$, $SrBi_2Ta_2O_3$, $SrTiO_3$, $PbTiO_3$, and $PbZrO_3$.

36. The method of claim 34, wherein forming the floating gate includes forming a polysilicon floating gate having a metal layer formed thereon in contact with the asymmetrical low tunnel barrier intergate insulator.

37. The method of claim 36, wherein forming the control gate includes forming a polysilicon control gate having a metal layer formed thereon in contact with the low tunnel barrier intergate insulator, wherein the metal layer formed on the polysilicon control gate includes a metal layer that has a different work function than the metal layer formed on the floating gate.

38. The method of claim 37, wherein forming the metal layer on the floating gate includes a parent metal for the asymmetrical low tunnel barrier intergate insulator and the metal layer formed on the control gate includes a metal layer having a work function in the range of 2.7 eV to 5.8 eV.

39. A method for forming an array of flash memory cells, comprising:
    forming a number of pillars extending outwardly from a substrate, wherein each pillar includes a first source/drain region, a body region, and a second source/drain region;
    forming a number of floating gates opposing the body regions in the number of pillars and separated therefrom by a gate oxide;
    forming a number of control gates opposing the floating gates;
    forming a number of buried sourcelines disposed below the number of pillars and coupled to the first source/drain regions along a first selected direction in the array of memory cells;
    forming a number of control gate lines formed integrally with the number of control gates along a second selected direction in the array of flash memory cells, wherein the number of control gate lines are separated from the floating gates by an asymmetrical low tunnel barrier intergate insulator, wherein forming the asymmetrical low tunnel barrier intergate insulator includes a forming low tunnel barrier intergate insulator having a number of small compositional ranges such that gradients can be formed by an applied electric field which produce different barrier heights at an interface with the floating gate and control gate; and
    forming a number of bitlines coupled to the second source/drain regions along a third selected direction in the array of flash memory cells.

40. The method of claim 39, wherein forming the asymmetrical low tunnel barrier intergate insulator includes forming a metal oxide insulator selected from the group consisting of $Al_2O_3$, $Ta_2O_5$, $TiO_2$, $ZrO_2$, $Nb_2O_5$, $SrBi_2Ta_2O_3$, $SrTiO_3$, $PbTiO_3$, and $PbZrO_3$.

41. The method of claim 39, wherein forming each floating gate includes forming a polysilicon floating gate having a metal layer formed thereon in contact with the low tunnel barrier intergate insulator.

42. The method of claim 41, wherein forming each control gate includes forming a polysilicon control gate having a metal layer formed thereon in contact with the low tunnel barrier intergate insulator, wherein the metal layer formed on the polysilicon control gate includes a metal layer that has a different work function than the metal layer formed on the floating gate.

43. The method of claim 42, wherein forming the metal layer on the floating gate includes a parent metal for the asymmetrical low tunnel barrier intergate insulator and the metal layer formed on the control gate includes a metal layer having a work function in the range of 2.7 eV to 5.8 eV.

44. The method of claim 39, wherein forming each floating gate includes forming a vertical floating gate in a trench below a top surface of each pillar such that each trench houses a pair of floating gates opposing the body regions in adjacent pillars on opposing sides of the trench.

45. The method of claim 39, wherein forming the plurality of control gate lines includes forming each control gate line in the trench below the top surface of the pillar and between the pair of floating gates, wherein each pair of floating gates shares a single control gate line, and wherein each floating gate includes a vertically oriented floating gate having a vertical length of less than 100 nanometers.

46. The method of claim 39, wherein forming the plurality of control gate lines includes forming a pair of control gate lines in each trench below the top surface of the pillar and between the pair of floating gates such that each control gate line addresses a floating gate on opposing sides of the trench respectively, and wherein the pair of control gate lines are separated by an insulator layer.

47. The method of claim 39, wherein forming the plurality of control gate lines includes forming the control gate lines such that the control gate lines are disposed vertically above the floating gates such that each pair of floating gates shares a single control gate line.

48. The method of claim 39, wherein forming the plurality of control gate lines includes forming the control gate lines such that the control gate lines are disposed vertically above the floating gates, and forming the plurality of control lines such that each one of the pair of floating gates is addressed by an independent one of the plurality of control lines.

49. The method of claim 39, wherein forming each floating gate includes forming a horizontally oriented floating gate in a trench below a top surface of each pillar such that each trench houses a floating gate opposing the body regions in adjacent pillars on opposite sides of the trench, and wherein each horizontally oriented floating gate has a vertical length of less than 100 nanometers opposing the body region of the pillars.

50. The method of claim 49, wherein the forming the plurality of control gate lines includes forming the control gate lines such that the control gate lines are disposed vertically above the floating gates.

51. A method for operating a non-volatile memory cell, comprising:

writing to a floating gate of the non-volatile memory cell using channel hot electron injection, wherein the non-volatile memory cell includes:
- a first source/drain region and a second source/drain region separated by a channel region in a substrate;
- a floating gate opposing the channel region and separated therefrom by a gate oxide;
- a control gate opposing the floating gate; and
- wherein the control gate is separated from the floating gate by an asymmetrical low tunnel barrier intergate insulator having a number of small compositional ranges such that gradients can be formed by an applied electric field which produce different barrier heights at an interface with the floating gate and control gate;

erasing charge from the floating gate by tunneling electrons off of the floating gate and onto the control gate through the asymmetrical low tunnel barrier insulator.

52. The method of claim 51, wherein erasing charge from the floating gate by tunneling electrons off of the floating gate and onto the control gate through the asymmetrical low tunnel barrier insulator includes:

providing a negative voltage to the substrate; and providing a large positive voltage to the control gate.

53. The method of claim 51, wherein the method further includes writing to the floating gate by tunneling electrons from the control gate to the floating gate through the asymmetrical low tunnel barrier insulator.

54. The method of claim 53, wherein writing to the floating gate by tunneling electrons from the control gate to the floating gate through the asymmetrical low tunnel barrier insulator further includes:

applying a positive voltage to the substrate; and applying a large negative voltage to the control gate.

55. The method of claim 51, wherein tunneling electrons from the floating gate to the control gate through the asymmetrical low tunnel barrier insulator includes tunneling electrons from the floating gate to the control gate through an asymmetrical low tunnel barrier insulator selected from the group consisting of $Al_2O_3$, $Ta_2O_5$, $TiO_2$, $ZrO_2$, $Nb_2O_5$, $SrBi_2Ta_2O_9$, $SrTiO_3$, $PbTiO_3$, and $PbZrO_3$.

56. The method of claim 51, wherein tunneling electrons from the floating gate to the control gate through the asymmetrical low tunnel barrier insulator includes tunneling electrons through the asymmetrical low tunnel barrier insulator having a barrier energy of approximately 2.0 eV.

57. The method of claim 51, wherein tunneling electrons from the floating gate to the control gate through the asymmetrical low tunnel barrier insulator includes tunneling electrons from a metal layer formed on the floating gate in contact with the low tunnel barrier intergate insulator to a metal layer formed on the control gate and also in contact with the low tunnel barrier intergate insulator.

58. A method for operating an array of flash memory cells, comprising:

writing to one or more floating gates for a number of non-volatile memory cells in the array of flash memory cells using channel hot electron injection, the array of flash memory cells includes:
- a number of pillars extending outwardly from a substrate, wherein each pillar includes a first source/drain region, a body region, and a second source/drain region;
- a number of floating gates opposing the body regions in the number of pillars and separated therefrom by a gate oxide;
- a number of control gates opposing the floating gates;
- a number of buried sourcelines disposed below the number of pillars and coupled to the first source/drain regions along a first selected direction in the array of memory cells;
- a number of control gate lines formed integrally with the number of control gates along a second selected direction in the array of flash memory cells, wherein the number of control gate lines are separated from the floating gates by an asymmetrical low tunnel barrier intergate insulator having a number of small compositional ranges such that gradients can be formed by an applied electric field which produce different barrier heights at an interface with the floating gate and control gate; and
- a number of bitlines coupled to the second source/drain regions along a third selected direction in the array of flash cells; and erasing charge from the one or more floating gates by tunneling electrons off of the one or more floating gates and onto the number of control gates through the asymmetrical low tunnel barrier insulator.

59. The method of claim 58, wherein erasing charge from the one or more floating gates by tunneling electrons off of the floating gate and onto the number of control gates through the asymmetrical low tunnel barrier insulator further includes:

providing a negative voltage to a substrate of one or more non-volatile memory cells; and providing a large positive voltage to the control gate for the one or more non-volatile memory cells.

60. The method of claim 59, wherein the method further includes erasing an entire row of non-volatile memory cells by providing a negative voltage to all of the substrates along an entire row of non-volatile memory cells and providing a large positive voltage to all of the control gates along the entire row of non-volatile memory cells.

61. The method of claim 59, wherein the method further includes erasing an entire block of non-volatile memory cells by providing a negative voltage to all of the substrates along multiple rows of non-volatile memory cells and providing a large positive voltage to all of the control gates along the multiple rows of non-volatile memory cells.

* * * * *

UNITED STATES PATENT AND TRADEMARK OFFICE
CERTIFICATE OF CORRECTION

PATENT NO.     : 6,952,032 B2
DATED          : October 4, 2005
INVENTOR(S)    : Forbes et al.

It is certified that error appears in the above-identified patent and that said Letters Patent is hereby corrected as shown below:

Title page,
Item [56], References Cited, OTHER PUBLICATIONS,
"Aarik, Jaan, et al.," reference, delete "2000,)" and insert -- 2000), --.
"Dipert, Brian," reference, delete "Mainstrem" and insert -- Mainstream --; and after "Spectrum" insert -- , --.
"Grimbolt, Jean, et al.," reference, delete "o2" and insert -- O2 --.
"Kim, H.," reference, delete "depostied" and insert -- deposited --; and after "Letters" insert -- , --.
"Kukli, Kaupo, et al.," reference, delete "depositin of zicronium" and insert -- deposition of zirconium --.
Item [57], ABSTRACT,
Line 13, delete "Zro$_2$" and insert -- ZrO$_2$ --.

Column 6,
Line 2, delete "(A$_2$O$_3$)." and insert -- (AI$_2$O$_3$). --.

Column 11,
Lines 36-37, delete "(<4mm)" and insert -- (<4nm) --.

Column 12,
Line 59, delete "-300" and insert -- ~300 --.
Line 60, delete "-10" and insert -- ~10 --.
Line 66, delete "10x," and insert -- 10X, --.

Column 13,
Line 63, delete "(1.5μm)" and insert -- (1.5nm) --.

Column 14,
Line 7, after "have" delete ",".

Column 18,
Line 53, delete "Zro$_2$" and insert -- ZrO$_2$ --.

UNITED STATES PATENT AND TRADEMARK OFFICE
CERTIFICATE OF CORRECTION

PATENT NO. : 6,952,032 B2
DATED : October 4, 2005
INVENTOR(S) : Forbes et al.

It is certified that error appears in the above-identified patent and that said Letters Patent is hereby corrected as shown below:

Column 25,
Line 1, delete "interplay" and insert -- interploy --.

Signed and Sealed this

Twenty-eighth Day of March, 2006

JON W. DUDAS
*Director of the United States Patent and Trademark Office*